US012320838B2

United States Patent
Luzinski et al.

(10) Patent No.: US 12,320,838 B2
(45) Date of Patent: Jun. 3, 2025

(54) TESTING DEVICE FOR ELECTRONIC DEVICES WITH IN-BAND VIRTUALIZED WIRED COMMUNICATIONS

(71) Applicant: NuCurrent, Inc., Chicago, IL (US)

(72) Inventors: Jason Luzinski, Chicago, IL (US); Michael Katz, Glen Ellyn, IL (US); Mark Melone, Frankfort, IL (US)

(73) Assignee: NuCurrent, Inc., Chicago, IL (US)

( * ) Notice: Subject to any disclaimer, the term of this patent is extended or adjusted under 35 U.S.C. 154(b) by 0 days.

(21) Appl. No.: 18/464,752

(22) Filed: Sep. 11, 2023

(65) Prior Publication Data
US 2024/0069091 A1    Feb. 29, 2024

Related U.S. Application Data

(63) Continuation of application No. 17/502,947, filed on Oct. 15, 2021, now Pat. No. 11,754,618.

(51) Int. Cl.
*G01R 31/28*     (2006.01)
*G01R 31/40*     (2020.01)
(Continued)

(52) U.S. Cl.
CPC ......... *G01R 31/2822* (2013.01); *G01R 31/40* (2013.01); *H02J 50/10* (2016.02); *H04B 5/79* (2024.01); *H04L 43/0847* (2013.01)

(58) Field of Classification Search
CPC ..... G01R 31/2822; G01R 31/40; H02J 50/10; H04B 5/0037; H04L 43/0847
(Continued)

(56) References Cited

U.S. PATENT DOCUMENTS 5,581,190 A    12/1996    Herring et al.
7,999,417 B2    8/2011    Kato et al.
(Continued)

FOREIGN PATENT DOCUMENTS

| CN | 105495880 A | 4/2016 |
|---|---|---|
| CN | 211747405 U | 10/2020 |
| WO | 2021098013 A1 | 5/2021 |

OTHER PUBLICATIONS

International Searching Authority, PCT International Search Report and Written Opinion, PCT International Application No. PCT/US2022/014404 dated May 3, 2022, 12 pages.
(Continued)

*Primary Examiner* — Giovanni Astacio-Oquendo
(74) *Attorney, Agent, or Firm* — Lee Sullivan Shea & Smith LLP

(57) ABSTRACT

A testing device for testing electronic devices includes a test controller and a wireless power transmission system. The test controller is configured to generate testing signals for transmission to at least one of the plurality of electronic devices and receive testing data, in response to the testing signals. The wireless power transmission system is configured to receive the testing signal from the test controller, generate a power signal and a first asynchronous serial data signal in accordance with a wireless power and data transfer protocol, the first asynchronous serial data signal based on the testing signals, decode the power signal to extract a second data signal compliant with the wireless power and data transfer protocol, and decode the second data signal compliant with the wireless power and data transfer protocol to extract a second asynchronous serial data signal, the second asynchronous serial data signal based on the testing data.

20 Claims, 19 Drawing Sheets

(51) Int. Cl.
*H02J 50/10* (2016.01)
*H04B 5/79* (2024.01)
*H04L 43/0823* (2022.01)

(58) Field of Classification Search
USPC ........................ 324/615, 612, 600
See application file for complete search history.

(56) References Cited

U.S. PATENT DOCUMENTS

| | | | |
|---|---|---|---|
| 9,928,391 | B1 | 3/2018 | Simons |
| 9,979,440 | B1 | 5/2018 | Leabman et al. |
| 10,122,220 | B2 | 11/2018 | Sankar |
| 10,284,025 | B2 * | 5/2019 | Zeine ............ G01R 31/318566 |
| 10,356,537 | B2 | 7/2019 | Niklaus et al. |
| 10,516,285 | B2 | 12/2019 | Pawar et al. |
| 10,700,742 | B1 | 6/2020 | Martchovsky |
| 10,790,694 | B2 * | 9/2020 | Kwon .................... H02J 50/60 |
| 10,923,927 | B2 | 2/2021 | Choi |
| 11,099,064 | B2 | 8/2021 | Matthys |
| 11,462,945 | B2 | 10/2022 | Goodchild et al. |
| 11,476,898 | B2 | 10/2022 | Peralta et al. |
| 11,496,004 | B2 | 11/2022 | Park |
| 11,539,400 | B2 | 12/2022 | Tsukamoto |
| 11,563,337 | B2 | 1/2023 | Yuan et al. |
| 11,575,269 | B1 | 2/2023 | Stousland et al. |
| 11,588,351 | B2 | 2/2023 | Danilovic et al. |
| 11,611,239 | B2 | 3/2023 | Pinciuc et al. |
| 11,648,692 | B2 | 5/2023 | Schaefer et al. |
| 11,648,693 | B2 | 5/2023 | Schaefer et al. |
| 11,670,968 | B2 | 6/2023 | Lee et al. |
| 11,831,033 | B2 | 11/2023 | Rayeski et al. |
| 2002/0127748 | A1 | 9/2002 | Gardner |
| 2005/0068161 | A1 | 3/2005 | Ichinose et al. |
| 2006/0077751 | A1 | 4/2006 | Oh et al. |
| 2007/0033474 | A1 | 2/2007 | Han et al. |
| 2011/0012432 | A1 | 1/2011 | Jung et al. |
| 2011/0285212 | A1 | 11/2011 | Higuma et al. |
| 2012/0025631 | A1 | 2/2012 | Shionoiri et al. |
| 2012/0306284 | A1 | 12/2012 | Lee et al. |
| 2012/0329405 | A1 | 12/2012 | Lee et al. |
| 2013/0027078 | A1 | 1/2013 | Nakano et al. |
| 2013/0035034 | A1 | 2/2013 | Kim et al. |
| 2013/0062966 | A1 | 3/2013 | Verghese et al. |
| 2013/0076153 | A1 | 3/2013 | Murayama et al. |
| 2013/0084800 | A1 | 4/2013 | Troberg et al. |
| 2013/0099586 | A1 | 4/2013 | Kato |
| 2013/0130629 | A1 | 5/2013 | Warren et al. |
| 2013/0212643 | A1 | 8/2013 | Takemura et al. |
| 2014/0159646 | A1 | 6/2014 | Sankar et al. |
| 2014/0159655 | A1 | 6/2014 | Kim et al. |
| 2014/0269886 | A1 | 9/2014 | Plumb et al. |
| 2014/0339923 | A1 | 11/2014 | Simopoulos et al. |
| 2015/0091523 | A1 | 4/2015 | Satyamoorthy et al. |
| 2015/0156284 | A1 | 6/2015 | Akhter et al. |
| 2015/0172441 | A1 | 6/2015 | Samhat |
| 2015/0263793 | A1 | 9/2015 | Ota |
| 2015/0340877 | A1 | 11/2015 | Lin et al. |
| 2015/0340910 | A1 | 11/2015 | Petras et al. |
| 2015/0370915 | A1 | 12/2015 | Kim |
| 2015/0371532 | A1 | 12/2015 | Esilva et al. |
| 2015/0372493 | A1 | 12/2015 | Sankar |
| 2016/0054396 | A1 | 2/2016 | Bell et al. |
| 2016/0094042 | A1 | 3/2016 | Maniktala et al. |
| 2016/0134334 | A1 | 5/2016 | Park et al. |
| 2016/0285311 | A1 | 9/2016 | Masumoto et al. |
| 2016/0336785 | A1 | 11/2016 | Gao et al. |
| 2016/0359371 | A1 * | 12/2016 | Wikstrand .............. H02J 50/80 |
| 2017/0026723 | A1 | 1/2017 | Wan et al. |
| 2017/0055109 | A1 | 2/2017 | Van Nieuwenhuyze et al. |
| 2017/0126070 | A1 | 5/2017 | Lee et al. |
| 2017/0272108 | A1 | 9/2017 | Filipovic et al. |
| 2017/0305280 | A1 | 10/2017 | Weidner et al. |
| 2018/0026481 | A1 | 1/2018 | Ku et al. |
| 2018/0062422 | A1 | 3/2018 | Kim et al. |
| 2018/0084406 | A1 | 3/2018 | Tandai et al. |
| 2018/0108882 | A1 | 4/2018 | Yang |
| 2018/0189224 | A1 | 7/2018 | Vadivelu et al. |
| 2018/0232894 | A1 | 8/2018 | Kim et al. |
| 2018/0269725 | A1 | 9/2018 | Yeo et al. |
| 2018/0269925 | A1 | 9/2018 | Matsuo |
| 2018/0309314 | A1 | 10/2018 | White, II et al. |
| 2018/0309315 | A1 | 10/2018 | Der et al. |
| 2019/0068300 | A1 | 2/2019 | Lu et al. |
| 2019/0097448 | A1 | 3/2019 | Partovi |
| 2019/0148966 | A1 * | 5/2019 | Choi ....................... H02J 50/10 |
| | | | 307/104 |
| 2019/0173529 | A1 | 6/2019 | Garcia et al. |
| 2019/0174239 | A1 | 6/2019 | Niklaus et al. |
| 2019/0252919 | A1 | 8/2019 | Ogawa et al. |
| 2019/0280532 | A1 | 9/2019 | Matsuo et al. |
| 2019/0303945 | A1 | 10/2019 | Mitra et al. |
| 2019/0354361 | A1 | 11/2019 | Li et al. |
| 2019/0391620 | A1 | 12/2019 | Matsuo |
| 2020/0052667 | A1 | 2/2020 | Jeon et al. |
| 2020/0076249 | A1 | 3/2020 | Mao et al. |
| 2020/0161907 | A1 | 5/2020 | Yang et al. |
| 2020/0249771 | A1 | 8/2020 | Kim et al. |
| 2020/0343745 | A1 | 10/2020 | Choi |
| 2020/0366135 | A1 | 11/2020 | Kim et al. |
| 2021/0083528 | A1 | 3/2021 | Stingu et al. |
| 2021/0099196 | A1 | 4/2021 | Tang et al. |
| 2021/0105045 | A1 | 4/2021 | Chen et al. |
| 2021/0148754 | A1 | 5/2021 | Matthys |
| 2021/0184487 | A1 | 6/2021 | Rafferty et al. |
| 2021/0257863 | A1 | 8/2021 | Sato |
| 2021/0265862 | A1 | 8/2021 | Yeo et al. |
| 2021/0266042 | A1 | 8/2021 | Park et al. |
| 2021/0296944 | A1 | 9/2021 | Shichino |
| 2021/0306036 | A1 | 9/2021 | Park et al. |
| 2022/0123590 | A1 | 4/2022 | Kim et al. |
| 2022/0200661 | A1 | 6/2022 | Lee et al. |
| 2022/0303167 | A1 | 9/2022 | Wang et al. |
| 2023/0079549 | A1 | 3/2023 | Luzinski et al. |
| 2023/0118888 | A1 * | 4/2023 | Luzinski .................. H04B 5/24 |
| | | | 455/41.1 |
| 2023/0261528 | A1 | 8/2023 | Park et al. |
| 2024/0088723 | A1 * | 3/2024 | Melone ................ H02J 7/00711 |

OTHER PUBLICATIONS

International Searching Authority, PCT International Search Report and Written Opinion, PCT International Application No. PCT/US2022/046191 dated Feb. 3, 2023, 11 pages.
International Searching Authority, PCT International Search Report and Written Opinion, PCT International Application No. PCT/US2022/046878 dated Feb. 15, 2023, 22 pages.
Qi Specification, Wireless Power Consortium [online], Version 1.3, Jan. 2021, [retrieved May 21, 2024], Retrieved from the Internet: URL: https://www.wirelesspowerconsortium.com/knowledge-base/specifications/download-the-qi-specifications/, 746 pages.
EP Extended Search Report, EP Application No. 22746740.4, dated Mar. 31, 2025, 9 pages.

* cited by examiner

TESTING DEVICE FOR ELECTRONIC DEVICES WITH IN-BAND VIRTUALIZED WIRED COMMUNICATIONS

CROSS REFERENCE TO RELATED APPLICATIONS

This application is a continuation of, and claims priority to, U.S. Non-Provisional application Ser. No. 17/502,947, filed on Oct. 15, 2021, and entitled "TESTING DEVICE FOR ELECTRONIC DEVICES WITH IN-BAND VIRTUALIZED WIRED COMMUNICATIONS," which is incorporated herein by reference in its entirety.

TECHNICAL FIELD

The present disclosure generally relates to systems and methods for wireless transfer of electrical power and electrical data signals, and, more particularly, to testing devices for wireless power transfer with in-band virtual wired communications.

BACKGROUND

Wireless connection systems are used in a variety of applications for the wireless transfer of electrical energy, electrical power, electromagnetic energy, electrical data signals, among other known wirelessly transmittable signals. Such systems often use inductive wireless power transfer, which occurs when magnetic fields created by a transmitting element induce an electric field, and hence, an electric current, in a receiving element. These transmitting and receiving elements will often take the form of an antenna, such as coiled wires the like.

Transmission of one or more of electrical energy, electrical power, electromagnetic energy and/or electronic data signals from one of such coiled antennas to another, generally, operates at an operating frequency and/or an operating frequency range. The operating frequency may be selected for any of a variety of reasons, such as, but not limited to, power transfer efficiency characteristics, power level characteristics, self-resonant frequency restraints, design requirements, adherence to standards bodies' required characteristics (e.g. electromagnetic interference (EMI) requirements, specific absorption rate (SAR) requirements, among other things), bill of materials (BOM), and/or form factor constraints, among other things. It is to be noted that, "self-resonating frequency," as known to those having skill in the art, generally refers to the resonant frequency of a passive component (e.g., an inductor) due to the parasitic characteristics of the component.

When such systems are operating to wirelessly transfer power from a transmission system to a receiver system via the antennas, it is often desired to contemporaneously communicate electronic data between the systems. In some example systems, wireless-power-related communications (e.g., validation procedures, electronic characteristics data communications, voltage data, current data, device type data, among other contemplated data communications related to wireless power transfer) are performed using in-band communications.

However, currently implemented in-band communications may be limited to slow data rates (e.g., about 1-3 kilobytes per second) and, thus, may not be desirable for use in transmitting device-related data from a transmitter to a receiver, wherein the receiver is operatively associated with an electronic device. Additionally, currently implemented in-band communications are of a data type or protocol that may not be proper or acceptable for the transmission and receipt of the aforementioned device-related data.

Thus, in some devices, even if a wireless power transfer system is utilized for powering or charging the device, the communications speed over the inductive connection of the wireless power transfer system may be too slow for meaningful data transmission, outside of communications associated with wireless power transfer. In such devices, a wired connection may be necessary for faster data transmission or receipt.

SUMMARY

A wireless power transfer system that utilizes data communications, systems, methods, and/or protocols, to replace a wired connection for communicating such device-related data and/or for wireless power related data, is desired. In such systems, it may be desired or required to continue the use of legacy communications protocols, which are utilized in wired communications, over a wireless connection. The systems and methods disclosed herein may be utilized to facilitate higher speed, one-way and/or two-way, data transfer during operations of a wireless power system, which may serve to replace a wired connection for performing such data transfer. Device-related data may include, but is not limited to including, operating software or firmware updates, digital media, operating instructions for the electronic device, among any other type of data outside of the realm of wireless-power-related data.

Such systems and methods for data communications, when utilized as part of a combined wireless power and wireless data system, may provide for much faster data communications, in comparison to legacy systems and methods for wireless power in-band communications.

In some examples, the wireless communications systems may utilize a buffered communications method, wherein data can be held in one or more buffers until the systems deems it is ready for communications. For instance, if one transceiver is attempting to pass a large amount of data, it may buffer such data until a point when the other side does not have a need to send data and then send the data at that point, which may allow communications to be accelerated since they can be sent "one way" over the virtual "wire" created by the inductive connection. Therefore, while such electromagnetic communications are not literally "two-way" communications utilizing two wires, virtual two-way communications are executable over the single inductive connection between the transmitter and receiver.

By utilizing buffers and the ability of both the transmitter and the receiver to encode data into the wireless power signal transmitted over the inductive connection between their respective antennas, such combinations of hardware and software may simulate the two-wire connections. Thus, the systems and methods disclosed herein may be implemented to provide a virtual serial and/or virtual universal asynchronous receiver-transmitter (UART) data communications system, method, or protocol, for data transfer during wireless power transfer.

In contrast to wired serial data transmission systems such as UART, the systems and methods disclosed herein advantageously eliminate the need for a wired connection between communicating devices, while enabling data communications that are interpretable by legacy systems that utilize known data protocols, such as UART. Further, in some examples, the systems and methods disclosed herein may enable manufacturers of such legacy-compatible systems to quickly introduce wireless data and/or power connections between devices, without needing to fully reprogram their data protocols and/or without having to hinder interoperability between devices.

In accordance with an aspect of the disclosure, a testing device for testing a plurality of electronic devices is disclosed. The electronic devices each include a wireless power receiver system. The testing device includes a test controller and a wireless power transmission system. The test controller is configured to generate testing signals for transmission to at least one of the plurality of electronic devices and receive testing data, in response to the testing signals. The wireless power transmission system includes a transmitter antenna and a transmission controller. The transmitter antenna is configured to couple with at least one receiver antenna of the wireless power receiver system of each of the plurality of electronic devices and transmit alternating current (AC) wireless signals to the at least one receiver antenna. The transmission controller is configured to receive the testing signal from the test controller, provide a driving signal for driving the transmitter antenna based on an operating frequency for the wireless power transfer system such that the transmitter antenna emits a transmission in accordance with the driving signal, wherein the driving signal is configured to generate a power signal and a first asynchronous serial data signal in accordance with a wireless power and data transfer protocol, the first asynchronous serial data signal based on the testing signals, decode the power signal to extract a second data signal compliant with the wireless power and data transfer protocol, and decode the second data signal compliant with the wireless power and data transfer protocol to extract a second asynchronous serial data signal, the second asynchronous serial data signal based on the testing data.

In a refinement, the testing signals are configured for testing a charge time for a load of at least one of the plurality of electronic devices and the testing data includes charge time data.

In a refinement, the testing signals are configured for testing communications failure rate and the testing data includes communications failure rate data.

In a refinement, the testing signals are configured for testing electronic device start up and the testing data includes electronic device start up data.

In a further refinement, the testing data includes start up failure rate data.

In another further refinement, the testing data includes start up duration data.

In a refinement, the first and second asynchronous serial data signal are universal asynchronous receiver-transmitter (UART) compliant signals.

In a further refinement, the wireless power and data transfer protocol is a Near Field Communication (NFC) protocol.

In yet a further refinement, the transmission controller and the receiver controller are further configured to generate the UART-compliant first and second data signals in accordance with the NFC data transfer protocol by packetizing the first and second UART-compliant data signals in a synchronous NFC data stream having a header with a synchronizing command and length command.

In yet another further refinement, the transmission controller and receiver controller are further configured to generate the UART-compliant first and second data signals in accordance with the NFC data transfer protocol by including at least one error check element after the UART-compliant data signals.

In yet a further refinement, the transmission controller and receiver controller are further configured to generate an acknowledgement (ACK) response to be transmitted when processing of the error check element indicates errorless receipt of the UART-compliant data signals.

In a further refinement, the transmission controller and receiver controller are further configured to generate a negative acknowledgement response (NACK) to be transmitted when processing of the error check element indicates erroneous receipt of a UART-compliant data signal.

In another further refinement, the device further includes a first set of one or more buffers in the wireless power transmission system and a second set of one or more buffers in the wireless power receiver system.

In a further refinement, the first set of one or more buffers is configured to order communications data for transmission and receipt by the wireless power transmission system and the second set of one or more buffers is configured to order communications data for transmission and receipt by the wireless power receiver system.

In yet a further refinement, an output of either or both of the first set of one or more buffers in the wireless power transmission system or the second set of one or more buffers in the wireless power receiver system is clocked to trigger buffered data for transmission.

In another further refinement, the first set of one or more buffers of the wireless power transmission system are triggered to output during one or more transmission communications windows and the second set of one or more buffers of the wireless power receiver system are triggered to output during one or more receiver communications windows.

These and other aspects and features of the present disclosure will be better understood when read in conjunction with the accompanying drawings.

While the following detailed description will be given with respect to certain illustrative embodiments, it should be understood that the drawings are not necessarily to scale and the disclosed embodiments are sometimes illustrated diagrammatically and in partial views. In addition, in certain instances, details which are not necessary for an understanding of the disclosed subject matter or which render other details too difficult to perceive may have been omitted. It should therefore be understood that this disclosure is not limited to the particular embodiments disclosed and illustrated herein, but rather to a fair reading of the entire disclosure and claims, as well as any equivalents thereto. Additional, different, or fewer components and methods may be included in the systems and methods.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings. For example, as noted above, UART is used herein as an example asynchronous communication scheme, and the NFC protocols are used as example synchronous communications scheme. However, other wired and wireless communications techniques may be used while embodying the principles of the present disclosure.

Figure 1:
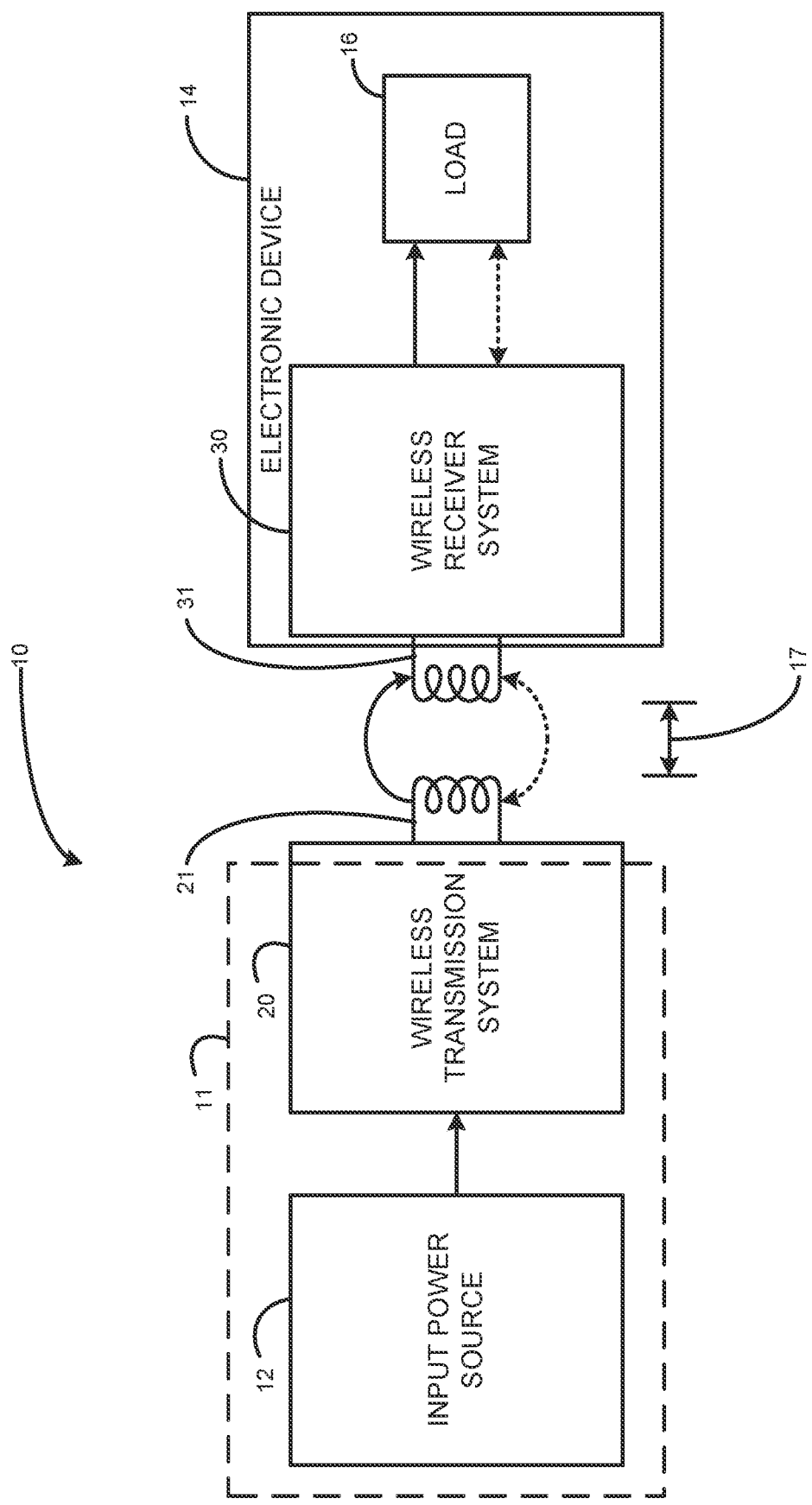
FIG. 1 is a block diagram of an embodiment of a system for wirelessly transferring one or more of electrical energy, electrical power signals, electrical power, electromagnetic energy, electronic data, and combinations thereof, in accordance with the present disclosure.

Referring now to the drawings and with specific reference to FIG. 1, a wireless power transfer system 10 is illustrated. The wireless power transfer system 10 provides for the wireless transmission of electrical signals, such as, but not limited to, electrical energy, electrical power, electrical power signals, electromagnetic energy, and electronically transmittable data ("electronic data"). As used herein, the term "electrical power signal" refers to an electrical signal transmitted specifically to provide meaningful electrical energy for charging and/or directly powering a load, whereas the term "electronic data signal" refers to an electrical signal that is utilized to convey data across a medium.

The wireless power transfer system 10 provides for the wireless transmission of electrical signals via near field magnetic coupling. As shown in the embodiment of FIG. 1, the wireless power transfer system 10 includes a wireless transmission system 20 and a wireless receiver system 30. The wireless receiver system is configured to receive electrical signals from, at least, the wireless transmission system 20. In some examples, such as examples wherein the wireless power transfer system is configured for wireless power transfer via the Near Field Communications Direct Charge (NFC-DC) or Near Field Communications Wireless Charging (NFC WC) draft or accepted standard, the wireless transmission system 20 may be referenced as a "listener" of the NFC-DC wireless transfer system 20 and the wireless receiver system 30 may be referenced as a "poller" of the NFC-DC wireless transfer system.

As illustrated, the wireless transmission system 20 and wireless receiver system 30 may be configured to transmit electrical signals across, at least, a separation distance or gap 17. A separation distance or gap, such as the gap 17, in the context of a wireless power transfer system, such as the system 10, does not include a physical connection, such as a wired connection. There may be intermediary objects located in a separation distance or gap, such as, but not limited to, air, a counter top, a casing for an electronic device, a plastic filament, an insulator, a mechanical wall, among other things; however, there is no physical, electrical connection at such a separation distance or gap.

Thus, the combination of the wireless transmission system 20 and the wireless receiver system 30 create an electrical connection without the need for a physical connection. As used herein, the term "electrical connection" refers to any facilitation of a transfer of an electrical current, voltage, and/or power from a first location, device, component, and/or source to a second location, device, component, and/or destination. An "electrical connection" may be a physical connection, such as, but not limited to, a wire, a trace, a via, among other physical electrical connections, connecting a first location, device, component, and/or source to a second location, device, component, and/or destination. Additionally or alternatively, an "electrical connection" may be a wireless power and/or data transfer, such as, but not limited to, magnetic, electromagnetic, resonant, and/or inductive field, among other wireless power and/or data transfers, connecting a first location, device, component, and/or source to a second location, device, component, and/or destination.

In some cases, the gap 17 may also be referenced as a "Z-Distance," because, if one considers an antenna 21, 31 each to be disposed substantially along respective common X-Y planes, then the distance separating the antennas 21, 31 is the gap in a "Z" or "depth" direction. However, flexible and/or non-planar coils are certainly contemplated by embodiments of the present disclosure and, thus, it is contemplated that the gap 17 may not be uniform, across an envelope of connection distances between the antennas 21, 31. It is contemplated that various tunings, configurations, and/or other parameters may alter the possible maximum distance of the gap 17, such that electrical transmission from the wireless transmission system 20 to the wireless receiver system 30 remains possible.

The wireless power transfer system 10 operates when the wireless transmission system 20 and the wireless receiver system 30 are coupled. As used herein, the terms "couples," "coupled," and "coupling" generally refer to magnetic field coupling, which occurs when a transmitter and/or any components thereof and a receiver and/or any components thereof are coupled to each other through a magnetic field. Such coupling may include coupling, represented by a coupling coefficient (k), that is at least sufficient for an induced electrical power signal, from a transmitter, to be harnessed by a receiver. Coupling of the wireless transmission system 20 and the wireless receiver system 30, in the system 10, may be represented by a resonant coupling coefficient of the system 10 and, for the purposes of wireless power transfer, the coupling coefficient for the system 10 may be in the range of about 0.01 and 0.9.

As illustrated, the wireless transmission system 20 may be associated with a host device 11, which may receive power from an input power source 12. The host device 11 may be any electrically operated device, circuit board, electronic assembly, dedicated charging device, or any other contemplated electronic device. Example host devices 11, with which the wireless transmission system 20 may be associated therewith, include, but are not limited to including, a device that includes an integrated circuit, cases for wearable electronic devices, receptacles for electronic devices, a portable computing device, clothing configured with electronics, storage medium for electronic devices, charging apparatus for one or multiple electronic devices, dedicated electrical charging devices, activity or sport related equipment, goods, and/or data collection devices, among other contemplated electronic devices.

As illustrated, one or both of the wireless transmission system 20 and the host device 11 are operatively associated with an input power source 12. The input power source 12 may be or may include one or more electrical storage devices, such as an electrochemical cell, a battery pack, and/or a capacitor, among other storage devices. Additionally or alternatively, the input power source 12 may be any electrical input source (e.g., any alternating current (AC) or direct current (DC) delivery port) and may include connection apparatus from said electrical input source to the wireless transmission system 20 (e.g., transformers, regulators, conductive conduits, traces, wires, or equipment, goods, computer, camera, mobile phone, and/or other electrical device connection ports and/or adaptors, such as but not limited to USB ports and/or adaptors, among other contemplated electrical components).

Electrical energy received by the wireless transmission system 20 is then used for at least two purposes: to provide electrical power to internal components of the wireless transmission system 20 and to provide electrical power to the transmitter antenna 21. The transmitter antenna 21 is configured to wirelessly transmit the electrical signals conditioned and modified for wireless transmission by the wireless transmission system 20 via near-field magnetic coupling (NFMC). Near-field magnetic coupling enables the transfer of signals wirelessly through magnetic induction between the transmitter antenna 21 and a receiving antenna 31 of, or associated with, the wireless receiver system 30. Near-field magnetic coupling may be and/or be referred to as "inductive coupling," which, as used herein, is a wireless power transmission technique that utilizes an alternating electromagnetic field to transfer electrical energy between two antennas. Such inductive coupling is the near field wireless transmission of magnetic energy between two magnetically coupled coils that are tuned to resonate at a similar frequency. Accordingly, such near-field magnetic coupling may enable efficient wireless power transmission via resonant transmission of confined magnetic fields. Further, such near-field magnetic coupling may provide connection via "mutual inductance," which, as defined herein is the production of an electromotive force in a circuit by a change in current in a second circuit magnetically coupled to the first.

In one or more embodiments, the inductor coils of either the transmitter antenna 21 or the receiver antenna 31 are strategically positioned to facilitate reception and/or transmission of wirelessly transferred electrical signals through near field magnetic induction. Antenna operating frequencies may comprise relatively high operating frequency ranges, examples of which may include, but are not limited to, 6.78 MHz (e.g., in accordance with the Rezence and/or Airfuel interface standard and/or any other proprietary interface standard operating at a frequency of 6.78 MHz), 13.56 MHz (e.g., in accordance with the NFC standard, defined by ISO/IEC standard 18092), 27 MHz, and/or an operating frequency of another proprietary operating mode. The operating frequencies of the antennas 21, 31 may be operating frequencies designated by the International Telecommunications Union (ITU) in the Industrial, Scientific, and Medical (ISM) frequency bands, including not limited to 6.78 MHz, 13.56 MHz, and 27 MHz, which are designated for use in wireless power transfer. In systems wherein the wireless power transfer system 10 is operating within the NFC-DC standards and/or draft standards, the operating frequency may be in a range of about 13.553 MHz to about 13.567 MHz.

The transmitting antenna and the receiving antenna of the present disclosure may be configured to transmit and/or receive electrical power having a magnitude that ranges from about 10 milliwatts (mW) to about 500 watts (W). In one or more embodiments the inductor coil of the transmitting antenna 21 is configured to resonate at a transmitting antenna resonant frequency or within a transmitting antenna resonant frequency band.

As known to those skilled in the art, a "resonant frequency" or "resonant frequency band" refers a frequency or frequencies wherein amplitude response of the antenna is at a relative maximum, or, additionally or alternatively, the frequency or frequency band where the capacitive reactance has a magnitude substantially similar to the magnitude of the inductive reactance. In one or more embodiments, the transmitting antenna resonant frequency is at a high frequency, as known to those in the art of wireless power transfer.

The wireless receiver system 30 may be associated with at least one electronic device 14, wherein the electronic device 14 may be any device that requires electrical power for any function and/or for power storage (e.g., via a battery and/or capacitor). Additionally, the electronic device 14 may be any device capable of receipt of electronically transmissible data. For example, the device may be, but is not limited to being, a handheld computing device, a mobile device, a portable appliance, an integrated circuit, an identifiable tag, a kitchen utility device, an electronic tool, an electric vehicle, a game console, a robotic device, a wearable electronic device (e.g., an electronic watch, electronically modified glasses, altered-reality (AR) glasses, virtual reality (VR) glasses, among other things), a portable scanning device, a portable identifying device, a sporting good, an embedded sensor, an Internet of Things (IoT) sensor, IoT enabled clothing, IoT enabled recreational equipment, industrial equipment, medical equipment, a medical device a tablet computing device, a portable control device, a remote controller for an electronic device, a gaming controller, among other things.

For the purposes of illustrating the features and characteristics of the disclosed embodiments, arrow-ended lines are utilized to illustrate transferrable and/or communicative signals and various patterns are used to illustrate electrical signals that are intended for power transmission and electrical signals that are intended for the transmission of data and/or control instructions. Solid lines indicate signal transmission of electrical energy over a physical and/or wireless power transfer, in the form of power signals that are, ultimately, utilized in wireless power transmission from the wireless transmission system 20 to the wireless receiver system 30. Further, dotted lines are utilized to illustrate electronically transmittable data signals, which ultimately may be wirelessly transmitted from the wireless transmission system 20 to the wireless receiver system 30.

While the systems and methods herein illustrate the transmission of wirelessly transmitted energy, wireless power signals, wirelessly transmitted power, wirelessly transmitted electromagnetic energy, and/or electronically transmittable data, it is certainly contemplated that the systems, methods, and apparatus disclosed herein may be utilized in the transmission of only one signal, various combinations of two signals, or more than two signals and, further, it is contemplated that the systems, method, and apparatus disclosed herein may be utilized for wireless transmission of other electrical signals in addition to or uniquely in combination with one or more of the above mentioned signals. In some examples, the signal paths of solid or dotted lines may represent a functional signal path, whereas, in practical application, the actual signal is routed through additional components en route to its indicated destination. For example, it may be indicated that a data signal routes from a communications apparatus to another communications apparatus; however, in practical application, the data signal may be routed through an amplifier, then through a transmission antenna, to a receiver antenna, where, on the receiver end, the data signal is decoded by a respective communications device of the receiver.

Figure 2:
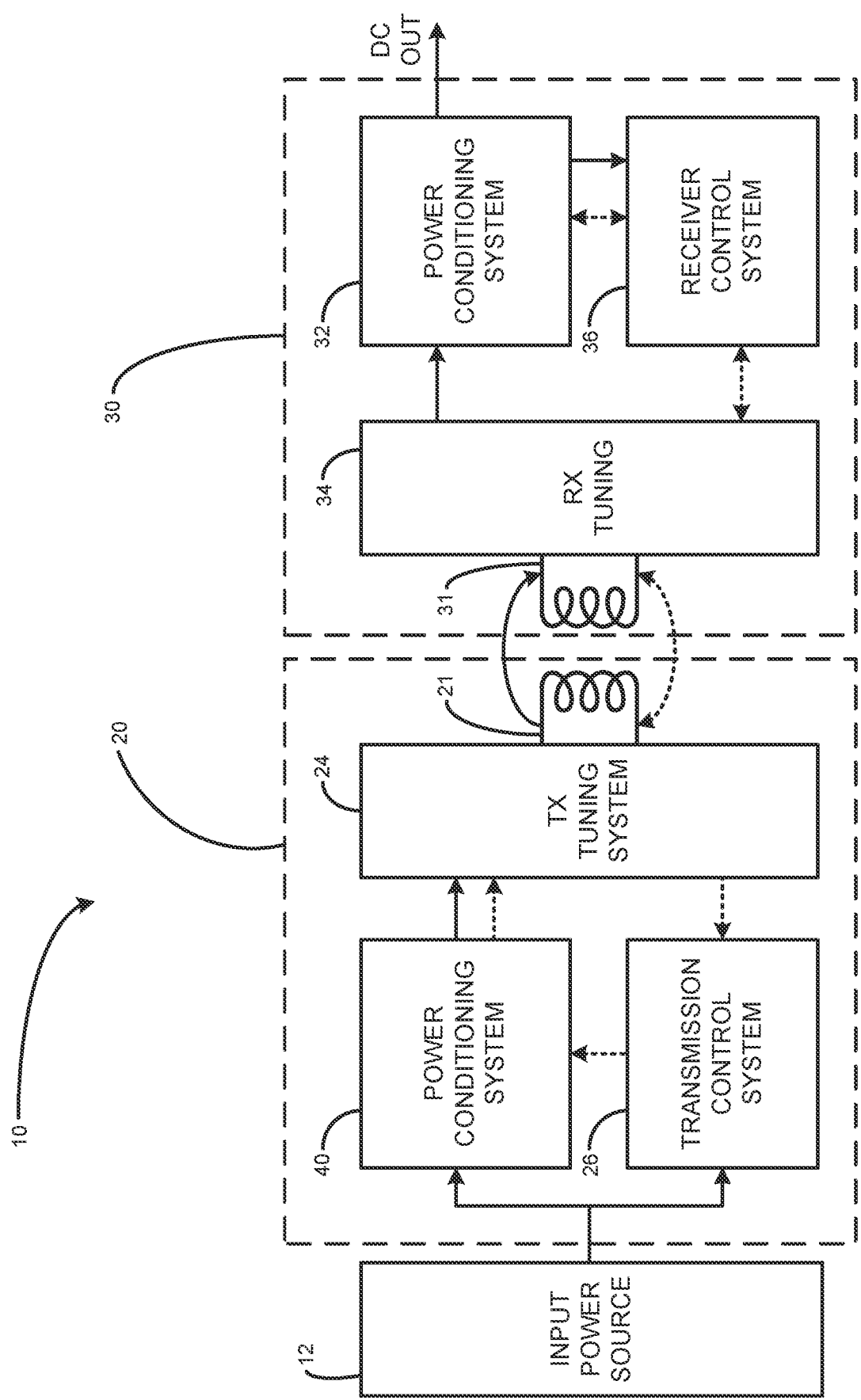
FIG. 2 is a block diagram illustrating components of a wireless transmission system of the system of FIG. 1 and a wireless receiver system of the system of FIG. 1, in accordance with FIG. 1 and the present disclosure.

Turning now to FIG. 2, the wireless connection system 10 is illustrated as a block diagram including example subsystems of both the wireless transmission system 20 and the wireless receiver system 30. The wireless transmission system 20 may include, at least, a power conditioning system 40, a transmission control system 26, a transmission tuning system 24, and the transmission antenna 21. A first portion of the electrical energy input from the input power source 12 is configured to electrically power components of the wireless transmission system 20 such as, but not limited to, the transmission control system 26. A second portion of the electrical energy input from the input power source 12 is conditioned and/or modified for wireless power transmission, to the wireless receiver system 30, via the transmission antenna 21. Accordingly, the second portion of the input energy is modified and/or conditioned by the power conditioning system 40. While not illustrated, it is certainly contemplated that one or both of the first and second portions of the input electrical energy may be modified, conditioned, altered, and/or otherwise changed prior to receipt by the power conditioning system 40 and/or transmission control system 26, by further contemplated subsystems (e.g., a voltage regulator, a current regulator, switching systems, fault systems, safety regulators, among other things).

Figure 3:
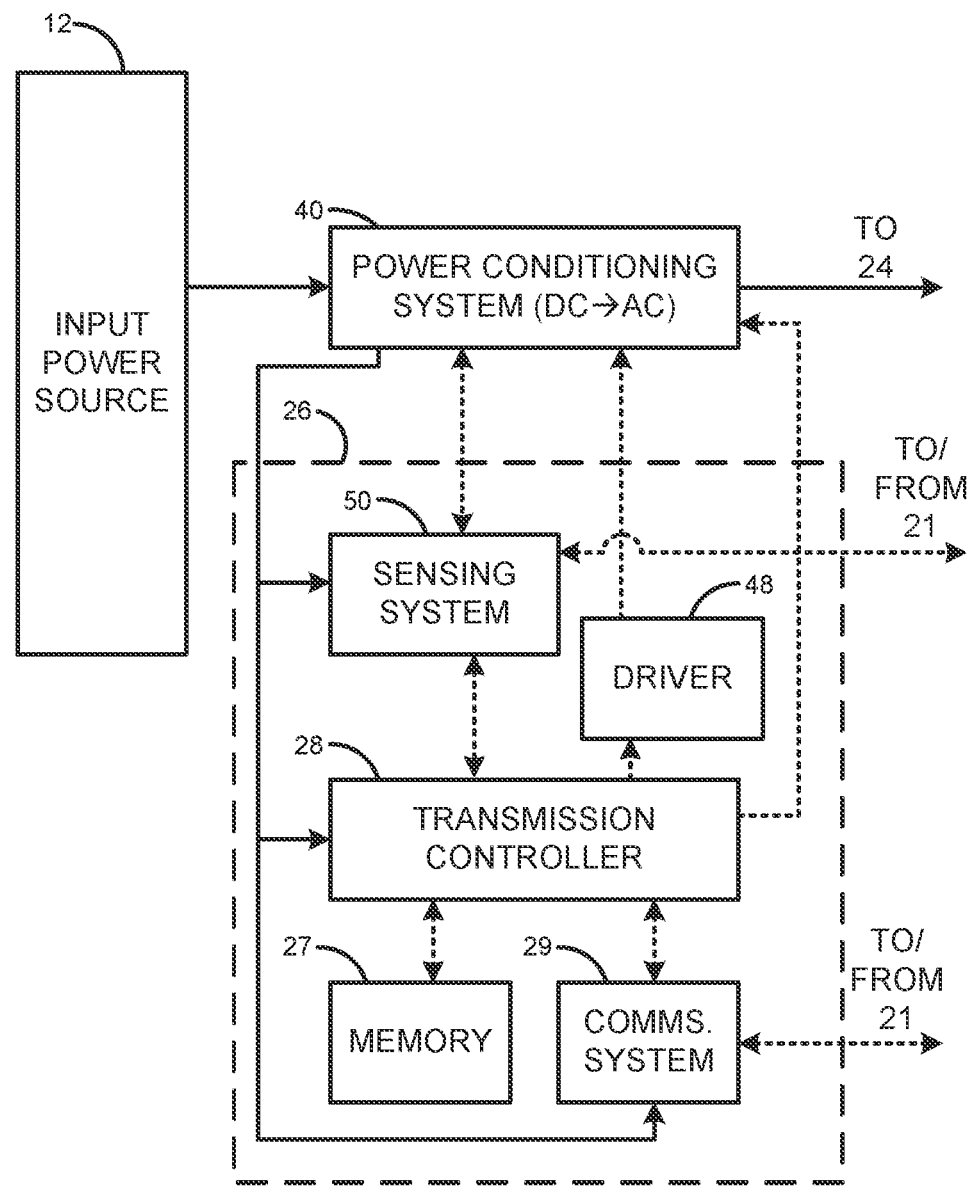
FIG. 3 is a block diagram illustrating components of a transmission control system of the wireless transmission system of FIG. 2, in accordance with FIG. 1, FIG. 2, and the present disclosure.

Referring now to FIG. 3, with continued reference to FIGS. 1 and 2, subcomponents and/or systems of the transmission control system 26 are illustrated. The transmission control system 26 may include a sensing system 50, a transmission controller 28, a communications system 29, a driver 48, and a memory 27.

The transmission controller 28 may be any electronic controller or computing system that includes, at least, a processor which performs operations, executes control algorithms, stores data, retrieves data, gathers data, controls and/or provides communication with other components and/or subsystems associated with the wireless transmission system 20, and/or performs any other computing or controlling task desired. The transmission controller 28 may be a single controller or may include more than one controller disposed to control various functions and/or features of the wireless transmission system 20. Functionality of the transmission controller 28 may be implemented in hardware and/or software and may rely on one or more data maps relating to the operation of the wireless transmission system 20. To that end, the transmission controller 28 may be operatively associated with the memory 27. The memory may include one or more of internal memory, external memory, and/or remote memory (e.g., a database and/or server operatively connected to the transmission controller 28 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory machine readable and/or computer readable memory media.

While particular elements of the transmission control system 26 are illustrated as independent components and/or circuits (e.g., the driver 48, the memory 27, the communications system 29, the sensing system 50, among other contemplated elements) of the transmission control system 26, such components may be integrated with the transmission controller 28. In some examples, the transmission controller 28 may be an integrated circuit configured to include functional elements of one or both of the transmission controller 28 and the wireless transmission system 20, generally.

Prior to providing data transmission and receipt details, it should be noted that either of the wireless transmission system 20 and the wireless receiver system 30 may send data to the other within the disclosed principles, regardless of which entity is wirelessly sending or wirelessly receiving power. As illustrated, the transmission controller 28 is in operative association, for the purposes of data transmission, receipt, and/or communication, with, at least, the memory 27, the communications system 29, the power conditioning system 40, the driver 48, and the sensing system 50. The driver 48 may be implemented to control, at least in part, the operation of the power conditioning system 40. In some examples, the driver 48 may receive instructions from the transmission controller 28 to generate and/or output a generated pulse width modulation (PWM) signal to the power conditioning system 40. In some such examples, the PWM signal may be configured to drive the power conditioning system 40 to output electrical power as an alternating current signal, having an operating frequency defined by the PWM signal. In some examples, PWM signal may be configured to generate a duty cycle for the AC power signal output by the power conditioning system 40. In some such examples, the duty cycle may be configured to be about 50% of a given period of the AC power signal.

The sensing system may include one or more sensors, wherein each sensor may be operatively associated with one or more components of the wireless transmission system 20 and configured to provide information and/or data. The term "sensor" is used in its broadest interpretation to define one or more components operatively associated with the wireless transmission system 20 that operate to sense functions, conditions, electrical characteristics, operations, and/or operating characteristics of one or more of the wireless transmission system 20, the wireless receiving system 30, the input power source 12, the host device 11, the transmission antenna 21, the receiver antenna 31, along with any other components and/or subcomponents thereof. Again, while the examples may illustrate a certain configuration, it should be appreciated that either of the wireless transmission system 20 and the wireless receiver system 30 may send data to the other within the disclosed principles, regardless of which entity is wirelessly sending or wirelessly receiving power.

Figure 4:
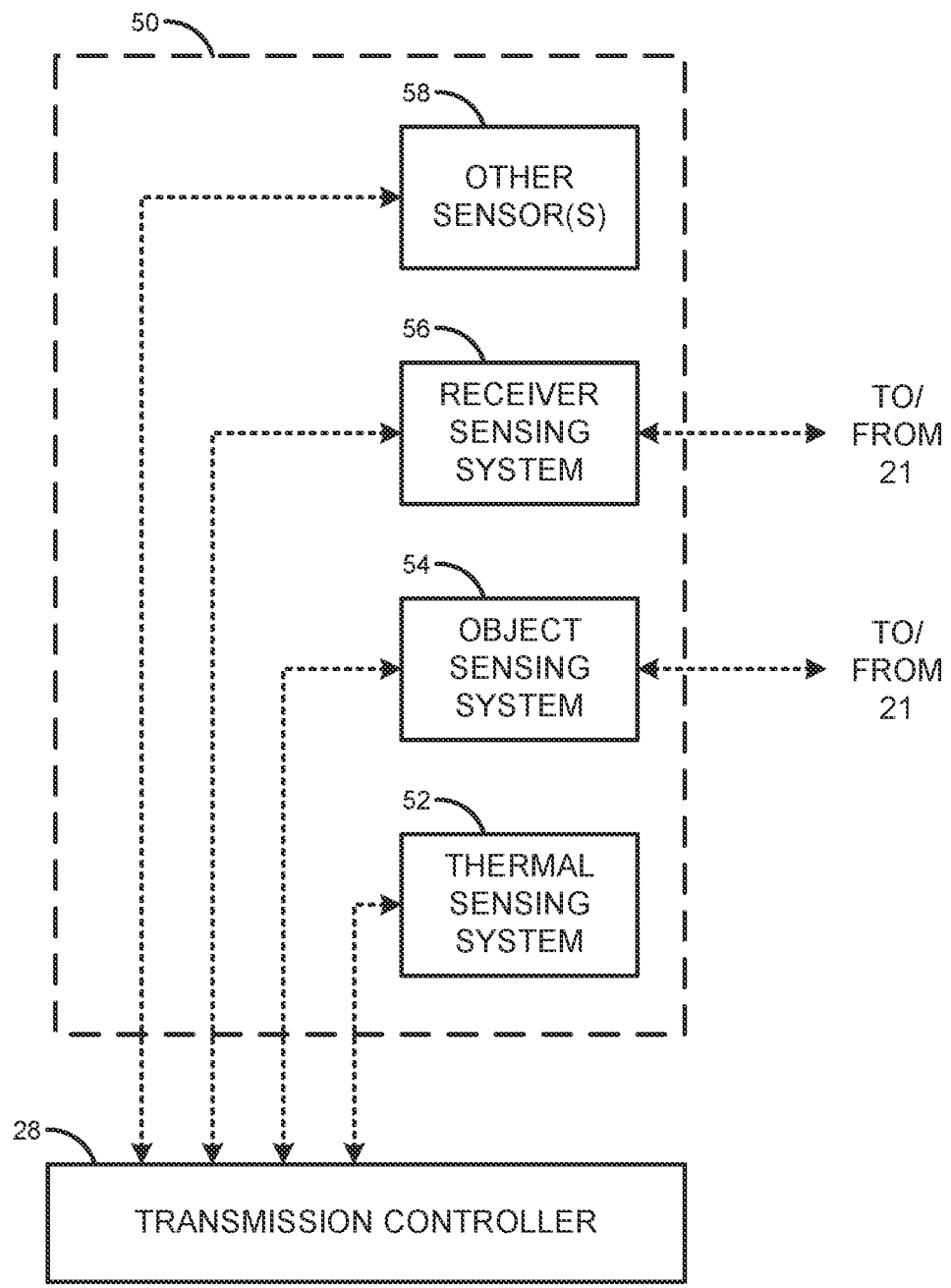
FIG. 4 is a block diagram illustrating components of a sensing system of the transmission control system of FIG. 3, in accordance with FIGS. 1-3 and the present disclosure.

As illustrated in the embodiment of FIG. 4, the sensing system 50 may include, but is not limited to including, a thermal sensing system 52, an object sensing system 54, a receiver sensing system 56, and/or any other sensor(s) 58. Within these systems, there may exist even more specific optional additional or alternative sensing systems addressing particular sensing aspects required by an application, such as, but not limited to: a condition-based maintenance sensing system, a performance optimization sensing system, a state-of-charge sensing system, a temperature management sensing system, a component heating sensing system, an IoT sensing system, an energy and/or power management sensing system, an impact detection sensing system, an electrical status sensing system, a speed detection sensing system, a device health sensing system, among others. The object sensing system 54, may be a foreign object detection (FOD) system.

Each of the thermal sensing system 52, the object sensing system 54, the receiver sensing system 56 and/or the other sensor(s) 58, including the optional additional or alternative systems, are operatively and/or communicatively connected to the transmission controller 28. The thermal sensing system 52 is configured to monitor ambient and/or component temperatures within the wireless transmission system 20 or other elements nearby the wireless transmission system 20. The thermal sensing system 52 may be configured to detect a temperature within the wireless transmission system 20 and, if the detected temperature exceeds a threshold temperature, the transmission controller 28 prevents the wireless transmission system 20 from operating. Such a threshold temperature may be configured for safety considerations, operational considerations, efficiency considerations, and/or any combinations thereof. In a non-limiting example, if, via input from the thermal sensing system 52, the transmission controller 28 determines that the temperature within the wireless transmission system 20 has increased from an acceptable operating temperature to an undesired operating temperature (e.g., in a non-limiting example, the internal temperature increasing from about 200° Celsius (C.) to about 50° C., the transmission controller 28 prevents the operation of the wireless transmission system 20 and/or reduces levels of power output from the wireless transmission system 20. In some non-limiting examples, the thermal sensing system 52 may include one or more of a thermocouple, a thermistor, a negative temperature coefficient (NTC) resistor, a resistance temperature detector (RTD), and/or any combinations thereof.

As depicted in FIG. 4, the transmission sensing system 50 may include the object sensing system 54. The object sensing system 54 may be configured to detect one or more of the wireless receiver system 30 and/or the receiver antenna 31, thus indicating to the transmission controller 28 that the receiver system 30 is proximate to the wireless transmission system 20. Additionally or alternatively, the object sensing system 54 may be configured to detect presence of unwanted objects in contact with or proximate to the wireless transmission system 20. In some examples, the object sensing system 54 is configured to detect the presence of an undesired object. In some such examples, if the transmission controller 28, via information provided by the object sensing system 54, detects the presence of an undesired object, then the transmission controller 28 prevents or otherwise modifies operation of the wireless transmission system 20. In some examples, the object sensing system 54 utilizes an impedance change detection scheme, in which the transmission controller 28 analyzes a change in electrical impedance observed by the transmission antenna 20 against a known, acceptable electrical impedance value or range of electrical impedance values.

Additionally or alternatively, the object sensing system 54 may utilize a quality factor (Q) change detection scheme, in which the transmission controller 28 analyzes a change from a known quality factor value or range of quality factor values of the object being detected, such as the receiver antenna 31. The "quality factor" or "Q" of an inductor can be defined as (frequency (Hz)×inductance (H))/resistance (ohms), where frequency is the operational frequency of the circuit, inductance is the inductance output of the inductor and resistance is the combination of the radiative and reactive resistances that are internal to the inductor. "Quality factor," as defined herein, is generally accepted as an index (figure of measure) that measures the efficiency of an apparatus like an antenna, a circuit, or a resonator. In some examples, the object sensing system 54 may include one or more of an optical sensor, an electro-optical sensor, a Hall effect sensor, a proximity sensor, and/or any combinations thereof.

The receiver sensing system 56 is any sensor, circuit, and/or combinations thereof configured to detect presence of any wireless receiving system that may be couplable with the wireless transmission system 20. In some examples, the receiver sensing system 56 and the object sensing system 54 may be combined, may share components, and/or may be embodied by one or more common components. In some examples, if the presence of any such wireless receiving system is detected, wireless transmission of electrical energy, electrical power, electromagnetic energy, and/or data by the wireless transmission system 20 to said wireless receiving system is enabled. In some examples, if the presence of a wireless receiver system is not detected, continued wireless transmission of electrical energy, electrical power, electromagnetic energy, and/or data is prevented from occurring. Accordingly, the receiver sensing system 56 may include one or more sensors and/or may be operatively associated with one or more sensors that are configured to analyze electrical characteristics within an environment of or proximate to the wireless transmission system 20 and, based on the electrical characteristics, determine presence of a wireless receiver system 30.

Figure 5:
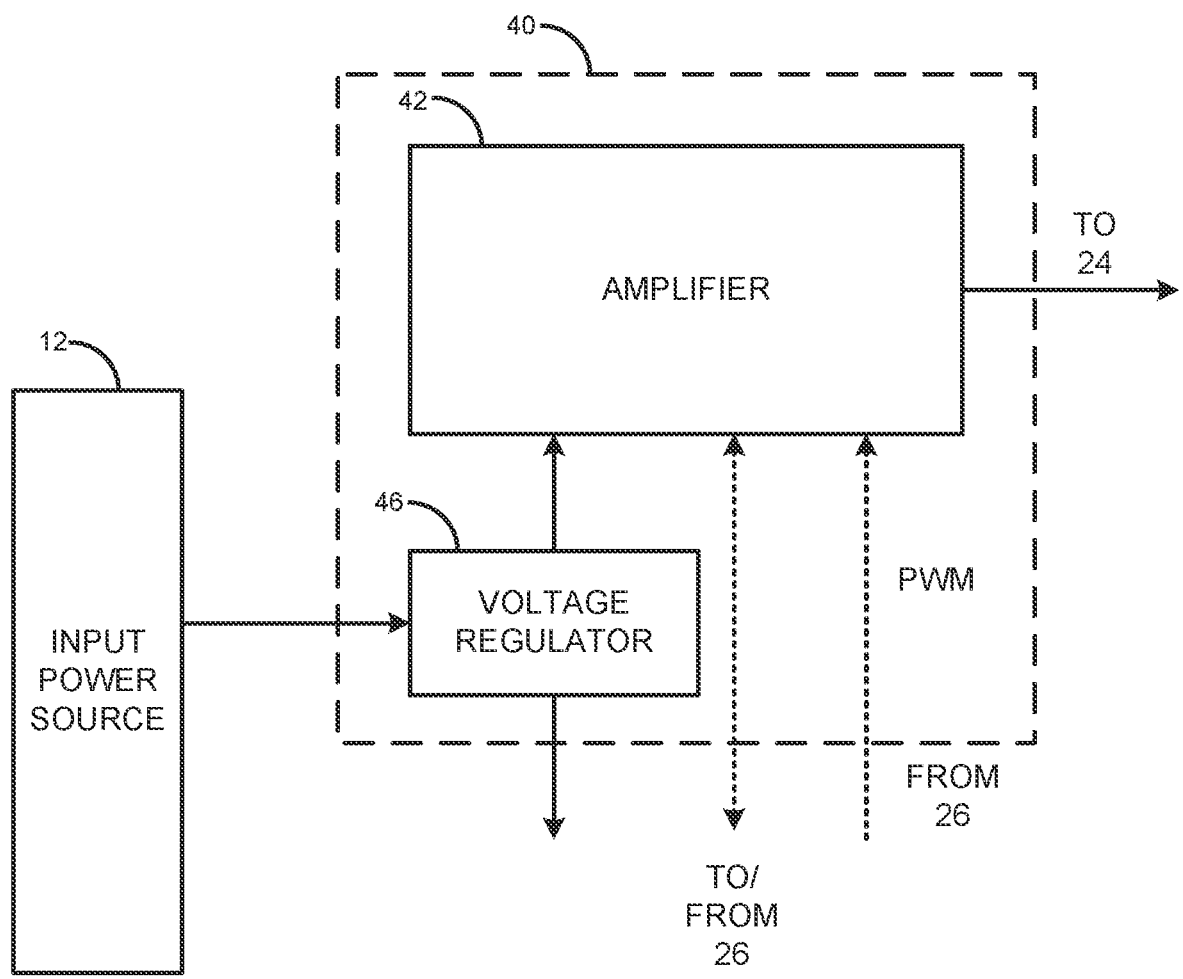
FIG. 5 is a block diagram illustrating components of a power conditioning system of the wireless transmission system of FIG. 2, in accordance with FIG. 1, FIG. 2, and the present disclosure.

Referring now to FIG. 5, and with continued reference to FIGS. 1-4, a block diagram illustrating an embodiment of the power conditioning system 40 is illustrated. At the power conditioning system 40, electrical power is received, generally, as a DC power source, via the input power source 12 itself or an intervening power converter, converting an AC source to a DC source (not shown). A voltage regulator 46 receives the electrical power from the input power source 12 and is configured to provide electrical power for transmission by the antenna 21 and provide electrical power for powering components of the wireless transmission system 21. Accordingly, the voltage regulator 46 is configured to convert the received electrical power into at least two electrical power signals, each at a proper voltage for operation of the respective downstream components: a first electrical power signal to electrically power any components of the wireless transmission system 20 and a second portion conditioned and modified for wireless transmission to the wireless receiver system 30. As illustrated in FIG. 3, such a first portion is transmitted to, at least, the sensing system 50, the transmission controller 28, and the communications system 29; however, the first portion is not limited to transmission to just these components and can be transmitted to any electrical components of the wireless transmission system 20.

The second portion of the electrical power is provided to an amplifier 42 of the power conditioning system 40, which is configured to condition the electrical power for wireless transmission by the antenna 21. The amplifier may function as an inverter, which receives an input DC power signal from the voltage regulator 46 and generates an AC as output, based, at least in part, on PWM input from the transmission control system 26. The amplifier 42 may be or include, for example, a power stage invertor, such as a dual field effect transistor power stage invertor or a quadruple field effect transistor power stage invertor. The use of the amplifier 42 within the power conditioning system 40 and, in turn, the wireless transmission system 20 enables wireless transmission of electrical signals having much greater amplitudes than if transmitted without such an amplifier. For example, the addition of the amplifier 42 may enable the wireless transmission system 20 to transmit electrical energy as an electrical power signal having electrical power from about 10 mW to about 500 W. In some examples, the amplifier 42 may be or may include one or more class-E power amplifiers. Class-E power amplifiers are efficiently tuned switching power amplifiers designed for use at high frequencies (e.g., frequencies from about 1 MHz to about 1 GHz). Generally, a class-E amplifier employs a single-pole switching element and a tuned reactive network between the switch and an output load (e.g., the antenna 21). Class E amplifiers may achieve high efficiency at high frequencies by only operating the switching element at points of zero current (e.g., on-to-off switching) or zero voltage (off to on switching). Such switching characteristics may minimize power lost in the switch, even when the switching time of the device is long compared to the frequency of operation. However, the amplifier 42 is certainly not limited to being a class-E power amplifier and may be or may include one or more of a class D amplifier, a class EF amplifier, an H invertor amplifier, and/or a push-pull invertor, among other amplifiers that could be included as part of the amplifier 42.

Figure 6:
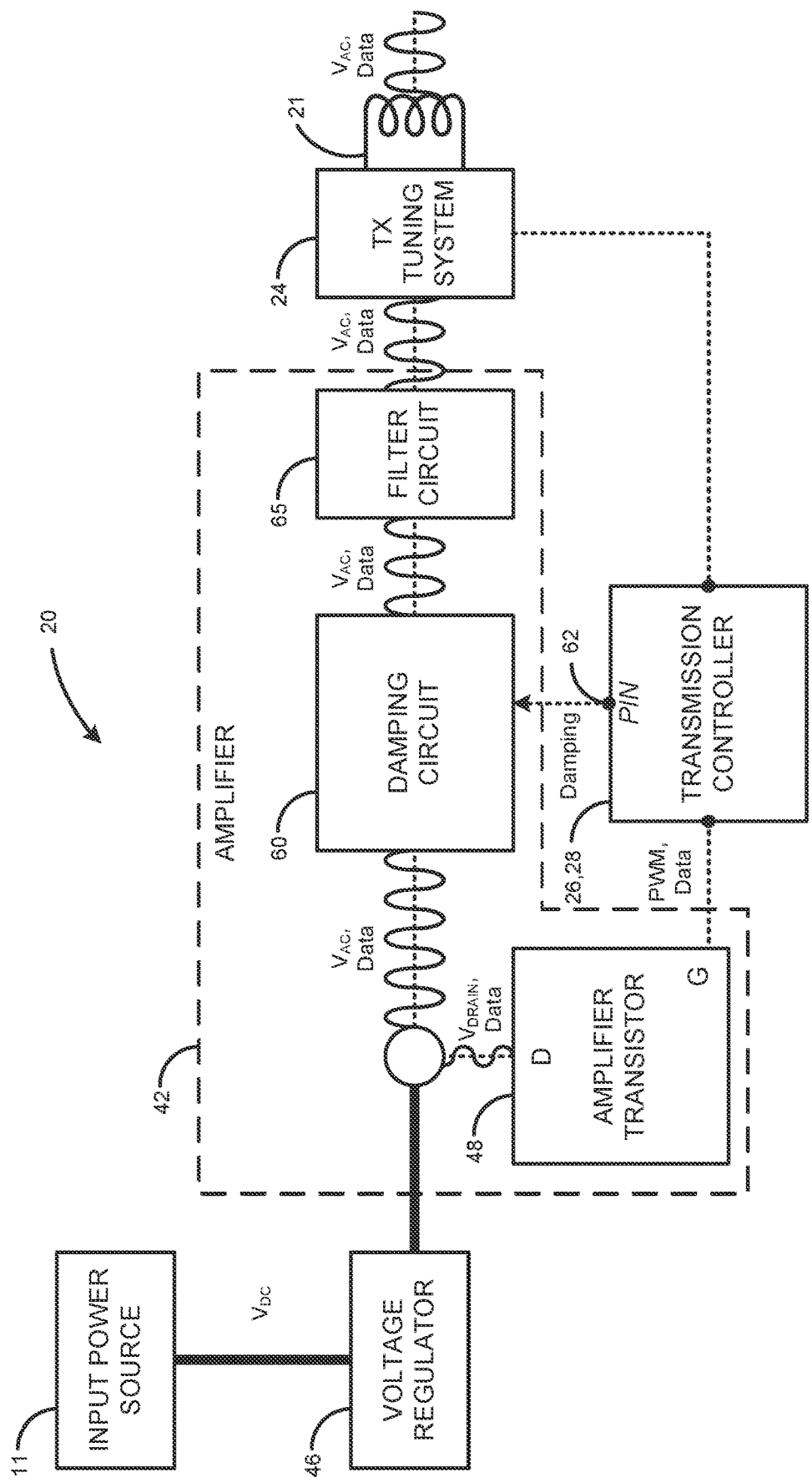
FIG. 6 is a block diagram of elements of the wireless transmission system of FIGS. 1-5, further illustrating components of an amplifier of the power conditioning system of FIG. 5 and signal characteristics for wireless power transmission, in accordance with FIGS. 1-5 and the present disclosure.
Figure 7:
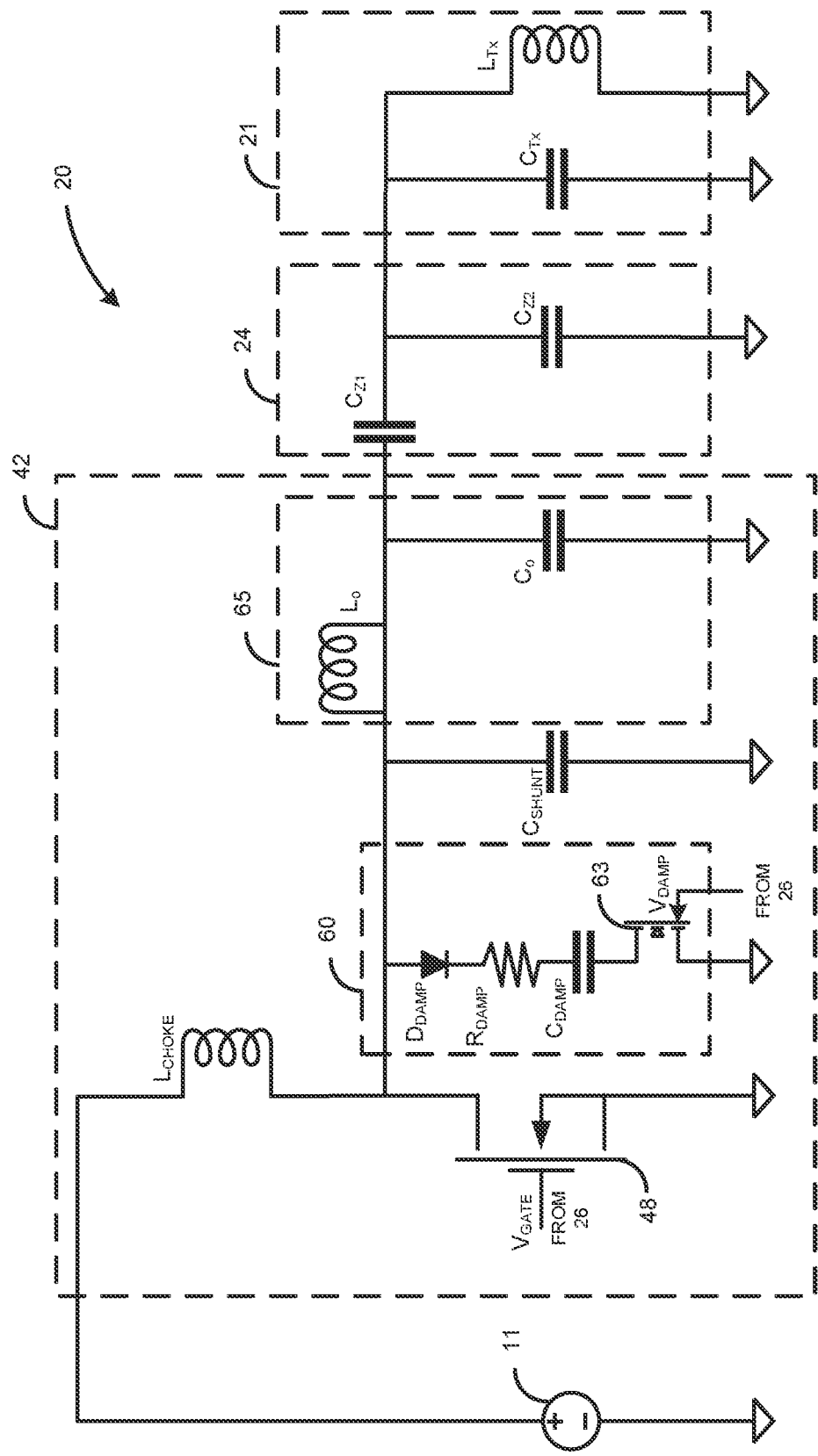
FIG. 7 is an electrical schematic diagram of elements of the wireless transmission system of FIGS. 1-6, further illustrating components of an amplifier of the power conditioning system of FIGS. 5-6, in accordance with FIGS. 1-6 and the present disclosure.

Turning now to FIGS. 6 and 7, the wireless transmission system 20 is illustrated, further detailing elements of the power conditioning system 40, the amplifier 42, the tuning system 24, among other things. The block diagram of the wireless transmission system 20 illustrates one or more electrical signals and the conditioning of such signals, altering of such signals, transforming of such signals, inverting of such signals, amplification of such signals, and combinations thereof. In FIG. 6, DC power signals are illustrated with heavily bolded lines, such that the lines are significantly thicker than other solid lines in FIG. 6 and other figures of the instant application, AC signals are illustrated as substantially sinusoidal wave forms with a thickness significantly less bolded than that of the DC power signal bolding, and data signals are represented as dotted lines. It is to be noted that the AC signals are not necessarily substantially sinusoidal waves and may be any AC waveform suitable for the purposes described below (e.g., a half sine wave, a square wave, a half square wave, among other waveforms). FIG. 7 illustrates sample electrical components for elements of the wireless transmission system, and subcomponents thereof, in a simplified form. Note that FIG. 7 may represent one branch or sub-section of a schematic for the wireless transmission system 20 and/or components of the wireless transmission system 20 may be omitted from the schematic illustrated in FIG. 7 for clarity.

As illustrated in FIG. 6 and discussed above, the input power source 11 provides an input direct current voltage ($V_{DC}$), which may have its voltage level altered by the voltage regulator 46, prior to conditioning at the amplifier 42. In some examples, as illustrated in FIG. 7, the amplifier 42 may include a choke inductor $L_{CHOKE}$, which may be utilized to block radio frequency interference in $V_{DC}$, while allowing the DC power signal of $V_{DC}$ to continue towards an amplifier transistor 48 of the amplifier 42. $V_{CHOKE}$ may be configured as any suitable choke inductor known in the art.

The amplifier 48 is configured to alter and/or invert $V_{DC}$ to generate an AC wireless signal $V_{AC}$, which, as discussed in more detail below, may be configured to carry one or both of an inbound and outbound data signal (denoted as "Data" in FIG. 6). The amplifier transistor 48 may be any switching transistor known in the art that is capable of inverting, converting, and/or conditioning a DC power signal into an AC power signal, such as, but not limited to, a field-effect transistor (FET), gallium nitride (GaN) FETS, bipolar junction transistor (BJT), and/or wide-bandgap (WBG) semiconductor transistor, among other known switching transistors. The amplifier transistor 48 is configured to receive a driving signal (denoted as "PWM" in FIG. 6) from at a gate of the amplifier transistor 48 (denoted as "G" in FIG. 6) and invert the DC signal $V_{DC}$ to generate the AC wireless signal at an operating frequency and/or an operating frequency band for the wireless power transmission system 20. The driving signal may be a PWM signal configured for such inversion at the operating frequency and/or operating frequency band for the wireless power transmission system 20.

The driving signal is generated and output by the transmission control system 26 and/or the transmission controller 28 therein, as discussed and disclosed above. The transmission controller 26, 28 is configured to provide the driving signal and configured to perform one or more of encoding wireless data signals (denoted as "Data" in FIG. 6), decoding the wireless data signals (denoted as "Data" in FIG. 6) and any combinations thereof. In some examples, the electrical data signals may be in band signals of the AC wireless power signal. In some such examples, such in-band signals may be on-off-keying (OOK) signals in-band of the AC wireless power signals. For example, Type-A communications, as described in the NFC Standards, are a form of OOK, wherein the data signal is on-off-keyed in a carrier AC wireless power signal operating at an operating frequency in a range of about 13.553 MHz to about 13.567 MHz.

However, when the power, current, impedance, phase, and/or voltage levels of an AC power signal are changed beyond the levels used in current and/or legacy hardware for high frequency wireless power transfer (over about 500 mW transmitted), such legacy hardware may not be able to properly encode and/or decode in-band data signals with the required fidelity for communications functions. Such higher power in an AC output power signal may cause signal degradation due to increasing rise times for an OOK rise, increasing fall time for an OOK fall, overshooting the required voltage in an OOK rise, and/or undershooting the voltage in an OOK fall, among other potential degradations to the signal due to legacy hardware being ill equipped for higher power, high frequency wireless power transfer. Thus, there is a need for the amplifier 42 to be designed in a way that limits and/or substantially removes rise and fall times, overshoots, undershoots, and/or other signal deficiencies from an in-band data signal during wireless power transfer. This ability to limit and/or substantially remove such deficiencies allows for the systems of the instant application to provide higher power wireless power transfer in high frequency wireless power transmission systems.

Figure 8:
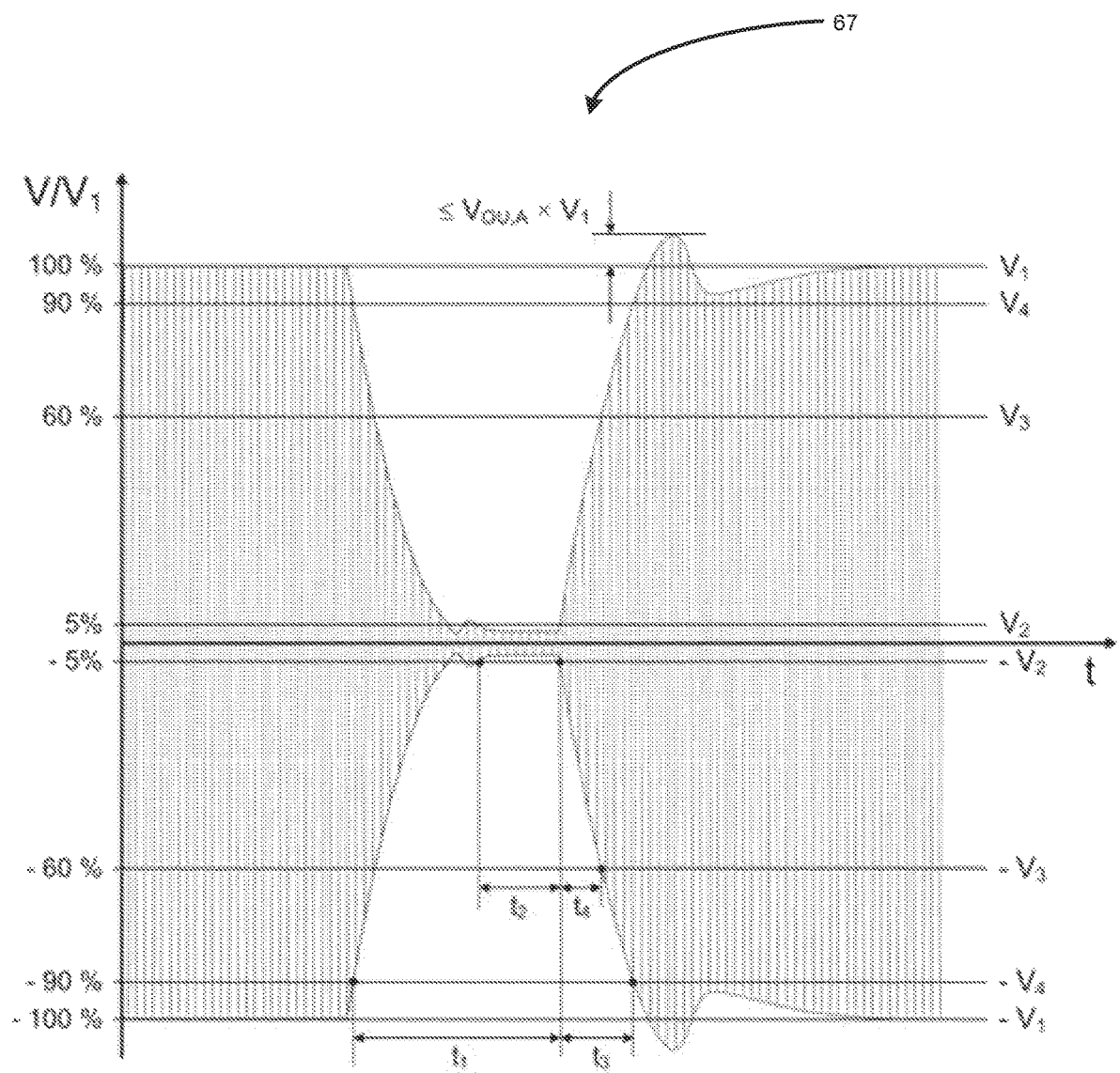
FIG. 8 is an exemplary plot illustrating rise and fall of "on" and "off" conditions when a signal has in-band communications via on-off keying.

For further exemplary illustration, FIG. 8 illustrates a plot for a fall and rise of an OOK in-band signal. The fall time ($t_1$) is shown as the time between when the signal is at 90% voltage ($V_4$) of the intended full voltage ($V_1$) and falls to about 5% voltage ($V_2$) of $V_1$. The rise time ($t_3$) is shown as the time between when the signal ends being at $V_2$ and rises to about $V_4$. Such rise and fall times may be read by a receiving antenna of the signal, and an applicable data communications protocol may include limits on rise and fall times, such that data is non-compliant and/or illegible by a receiver if rise and/or fall times exceed certain bounds.

Returning now to FIGS. 6 and 7, to achieve limitation and/or substantial removal of the mentioned deficiencies, the amplifier 42 includes a damping circuit 60. The damping circuit 60 is configured for damping the AC wireless signal during transmission of the AC wireless signal and associated data signals. The damping circuit 60 may be configured to reduce rise and fall times during OOK signal transmission, such that the rate of the data signals may not only be compliant and/or legible, but may also achieve faster data rates and/or enhanced data ranges, when compared to legacy systems. For damping the AC wireless power signal, the damping circuit includes, at least, a damping transistor 63, which is configured for receiving a damping signal ($V_{damp}$) from the transmission controller 62. The damping signal is configured for switching the damping transistor (on/off) to control damping of the AC wireless signal during the transmission and/or receipt of wireless data signals. Such transmission of the AC wireless signals may be performed by the transmission controller 28 and/or such transmission may be via transmission from the wireless receiver system 30, within the coupled magnetic field between the antennas 21, 31.

In examples wherein the data signals are conveyed via OOK, the damping signal may be substantially opposite and/or an inverse to the state of the data signals. This means that if the OOK data signals are in an "on" state, the damping signals instruct the damping transistor to turn "off" and thus the signal is not dissipated via the damping circuit 60 because the damping circuit is not set to ground and, thus, a short from the amplifier circuit and the current substantially bypasses the damping circuit 60. If the OOK data signals are in an "off" state, then the damping signals may be "on" and, thus, the damping transistor 63 is set to an "on" state and the current flowing of $V_{AC}$ is damped by the damping circuit. Thus, when "on," the damping circuit 60 may be configured to dissipate just enough power, current, and/or voltage, such that efficiency in the system is not substantially affected and such dissipation decreases rise and/or fall times in the OOK signal. Further, because the damping signal may instruct the damping transistor 63 to turn "off" when the OOK signal is "on," then it will not unnecessarily damp the signal, thus mitigating any efficiency losses from $V_{AC}$, when damping is not needed. While depicted as utilizing OOK coding, other forms of in band coding may be utilized for coding the data signals, such as, but not limited to, amplitude shift keying (ASK).

As illustrated in FIG. 7, the branch of the amplifier 42 which may include the damping circuit 60, is positioned at the output drain of the amplifier transistor 48. While it is not necessary that the damping circuit 60 be positioned here, in some examples, this may aid in properly damping the output AC wireless signal, as it will be able to damp at the node closest to the amplifier transistor 48 output drain, which is the first node in the circuit wherein energy dissipation is desired. In such examples, the damping circuit is in electrical parallel connection with a drain of the amplifier transistor 48. However, it is certainly possible that the damping circuit be connected proximate to the antenna 21, proximate to the transmission tuning system 24, and/or proximate to a filter circuit 24.

While the damping circuit 60 is capable of functioning to properly damp the AC wireless signal for proper communications at higher power high frequency wireless power transmission, in some examples, the damping circuit may include additional components. For instance, as illustrated, the damping circuit 60 may include one or more of a damping diode $D_{DAMP}$, a damping resistor $R_{DAMP}$, a damping capacitor $C_{DAMP}$, and/or any combinations thereof. $R_{DAMP}$ may be in electrical series with the damping transistor 63 and the value of $R_{DAMP}$ (ohms) may be configured such that it dissipates at least some power from the power signal, which may serve to accelerate rise and fall times in an amplitude shift keying signal, an OOK signal, and/or combinations thereof. In some examples, the value of $R_{DAMP}$ is selected, configured, and/or designed such that $R_{DAMP}$ dissipates the minimum amount of power to achieve the fastest rise and/or fall times in an in-band signal allowable and/or satisfy standards limitations for minimum rise and/or fall times; thereby achieving data fidelity at maximum efficiency (less power lost to $R_{DAMP}$) as well as maintaining data fidelity when the system is unloaded and/or under lightest load conditions.

$C_{DAMP}$ may also be in series connection with one or both of the damping transistor 63 and $R_{DAMP}$. $C_{DAMP}$ may be configured to smooth out transition points in an in-band signal and limit overshoot and/or undershoot conditions in such a signal. Further, in some examples, $C_{DAMP}$ may be configured for ensuring the damping performed is 180 degrees out of phase with the AC wireless power signal, when the transistor is activated via the damping signal.

$D_{DAMP}$ may further be included in series with one or more of the damping transistor 63, $R_{DAMP}$, $C_{DAMP}$, and/or any combinations thereof. $D_{DAMP}$ is positioned, as shown, such that a current cannot flow out of the damping circuit 60, when the damping transistor 63 is in an off state. The inclusion of $D_{DAMP}$ may prevent power efficiency loss in the AC power signal when the damping circuit is not active or "on." Indeed, while the damping transistor 63 is designed such that, in an ideal scenario, it serves to effectively short the damping circuit when in an "off" state, in practical terms, some current may still reach the damping circuit and/or some current may possibly flow in the opposite direction out of the damping circuit 60. Thus, inclusion of $D_{DAMP}$ may prevent such scenarios and only allow current, power, and/or voltage to be dissipated towards the damping transistor 63. This configuration, including $D_{DAMP}$, may be desirable when the damping circuit 60 is connected at the drain node of the amplifier transistor 48, as the signal may be a half-wave sine wave voltage and, thus, the voltage of $V_{AC}$ is always positive.

Beyond the damping circuit 60, the amplifier 42, in some examples, may include a shunt capacitor $C_{SHUNT}$. $C_{SHUNT}$ may be configured to shunt the AC power signal to ground and charge voltage of the AC power signal. Thus, $C_{SHUNT}$ may be configured to maintain an efficient and stable waveform for the AC power signal, such that a duty cycle of about 50% is maintained and/or such that the shape of the AC power signal is substantially sinusoidal at positive voltages.

In some examples, the amplifier 42 may include a filter circuit 65. The filter circuit 65 may be designed to mitigate and/or filter out electromagnetic interference (EMI) within the wireless transmission system 20. Design of the filter circuit 65 may be performed in view of impedance transfer and/or effects on the impedance transfer of the wireless power transmission 20 due to alterations in tuning made by the transmission tuning system 24. To that end, the filter circuit 65 may be or include one or more of a low pass filter, a high pass filter, and/or a band pass filter, among other filter circuits that are configured for, at least, mitigating EMI in a wireless power transmission system.

As illustrated, the filter circuit 65 may include a filter inductor $L_o$ and a filter capacitor $C_o$. The filter circuit 65 may have a complex impedance and, thus, a resistance through the filter circuit 65 may be defined as $R_o$. In some such examples, the filter circuit 65 may be designed and/or configured for optimization based on, at least, a filter quality factor $\gamma_{FILTER}$, defined as:

$$\gamma_{FILTER} = \frac{1}{R_o}\sqrt{\frac{L_o}{C_o}}.$$

In a filter circuit 65 wherein it includes or is embodied by a low pass filter, the cut-off frequency ($\omega_o$) of the low pass filter is defined as:

$$\omega_o = \frac{1}{\sqrt{L_o C_o}}.$$

In some wireless power transmission systems 20, it is desired that the cutoff frequency be about 1.03-1.4 times greater than the operating frequency of the antenna. Experimental results have determined that, in general, a larger $\gamma_{FILTER}$ may be preferred, because the larger $\gamma_{FILTER}$ can improve voltage gain and improve system voltage ripple and timing. Thus, the above values for $L_o$ and $C_o$ may be set such that $\gamma_{FILTER}$ can be optimized to its highest, ideal level (e.g., when the system 10 impedance is conjugately matched for maximum power transfer), given cutoff frequency restraints and available components for the values of $L_o$ and $C_o$.

As illustrated in FIG. 7, the conditioned signal(s) from the amplifier 42 is then received by the transmission tuning system 24, prior to transmission by the antenna 21. The transmission tuning system 24 may include tuning and/or impedance matching, filters (e.g. a low pass filter, a high pass filter, a "pi" or "Π" filter, a "T" filter, an "L" filter, a "LL" filter, and/or an L-C trap filter, among other filters), network matching, sensing, and/or conditioning elements configured to optimize wireless transfer of signals from the wireless transmission system 20 to the wireless receiver system 30. Further, the transmission tuning system 24 may include an impedance matching circuit, which is designed to match impedance with a corresponding wireless receiver system 30 for given power, current, and/or voltage requirements for wireless transmission of one or more of electrical energy, electrical power, electromagnetic energy, and electronic data. The illustrated transmission tuning system 24 includes, at least, $C_{Z1}$, $C_{Z2}$, and (operatively associated with the antenna 21) values, all of which may be configured for impedance matching in one or both of the wireless transmission system 20 and the broader system 10. It is noted that $C_{Tx}$ refers to the intrinsic capacitance of the antenna 21.

Figure 9:
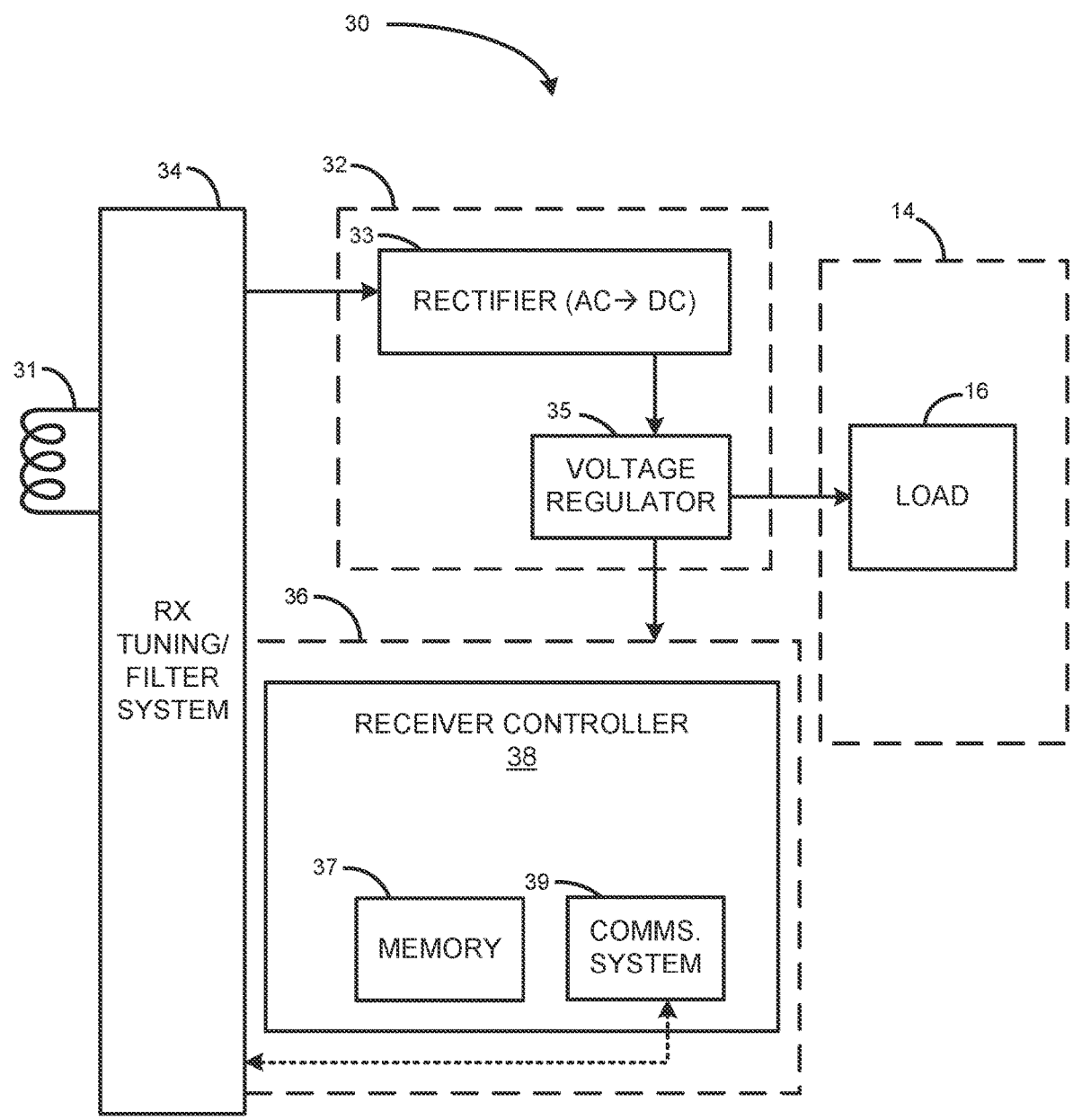
FIG. 9 is a block diagram illustrating components of a receiver control system and a receiver power conditioning system of the wireless receiver system of FIG. 2, in accordance with FIG. 1, FIG. 2, and the present disclosure.

Turning now to FIG. 9 and with continued reference to, at least, FIGS. 1 and 2, the wireless receiver system 30 is illustrated in further detail. The wireless receiver system 30 is configured to receive, at least, electrical energy, electrical power, electromagnetic energy, and/or electrically transmittable data via near field magnetic coupling from the wireless transmission system 20, via the transmission antenna 21. As illustrated in FIG. 9, the wireless receiver system 30 includes, at least, the receiver antenna 31, a receiver tuning and filtering system 34, a power conditioning system 32 and a receiver control system 36. The receiver tuning and filtering system 34 may be configured to substantially match the electrical impedance of the wireless transmission system 20. In some examples, the receiver tuning and filtering system 34 may be configured to dynamically adjust and substantially match the electrical impedance of the receiver antenna 31 to a characteristic impedance of the power generator or the load at a driving frequency of the transmission antenna 20.

As illustrated, the power conditioning system 32 includes a rectifier 33 and a voltage regulator 35. In some examples, the rectifier 33 is in electrical connection with the receiver tuning and filtering system 34. The rectifier 33 is configured to modify the received electrical energy from an alternating current electrical energy signal to a direct current electrical energy signal. In some examples, the rectifier 33 is comprised of at least one diode. Some non-limiting example configurations for the rectifier 33 include, but are not limited to including, a full wave rectifier, including a center tapped full wave rectifier and a full wave rectifier with filter, a half wave rectifier, including a half wave rectifier with filter, a bridge rectifier, including a bridge rectifier with filter, a split supply rectifier, a single phase rectifier, a three phase rectifier, a voltage doubler, a synchronous voltage rectifier, a controlled rectifier, an uncontrolled rectifier, and a half controlled rectifier. As electronic devices may be sensitive to voltage, additional protection of the electronic device may be provided by clipper circuits or devices. In this respect, the rectifier 33 may further include a clipper circuit or a clipper device, which is a circuit or device that removes either the positive half (top half), the negative half (bottom half), or both the positive and the negative halves of an input AC signal. In other words, a clipper is a circuit or device that limits the positive amplitude, the negative amplitude, or both the positive and the negative amplitudes of the input AC signal.

Some non-limiting examples of a voltage regulator 35 include, but are not limited to, including a series linear voltage regulator, a buck convertor, a low dropout (LDO) regulator, a shunt linear voltage regulator, a step up switching voltage regulator, a step down switching voltage regulator, an inverter voltage regulator, a Zener controlled transistor series voltage regulator, a charge pump regulator, and an emitter follower voltage regulator. The voltage regulator 35 may further include a voltage multiplier, which is as an electronic circuit or device that delivers an output voltage having an amplitude (peak value) that is two, three, or more times greater than the amplitude (peak value) of the input voltage. The voltage regulator 35 is in electrical connection with the rectifier 33 and configured to adjust the amplitude of the electrical voltage of the wirelessly received electrical energy signal, after conversion to AC by the rectifier 33. In some examples, the voltage regulator 35 may an LDO linear voltage regulator; however, other voltage regulation circuits and/or systems are contemplated. As illustrated, the direct current electrical energy signal output by the voltage regulator 35 is received at the load 16 of the electronic device 14. In some examples, a portion of the direct current electrical power signal may be utilized to power the receiver control system 36 and any components thereof; however, it is certainly possible that the receiver control system 36, and any components thereof, may be powered and/or receive signals from the load 16 (e.g., when the load 16 is a battery and/or other power source) and/or other components of the electronic device 14.

The receiver control system 36 may include, but is not limited to including, a receiver controller 38, a communications system 39 and a memory 37. The receiver controller 38 may be any electronic controller or computing system that includes, at least, a processor which performs operations, executes control algorithms, stores data, retrieves data, gathers data, controls and/or provides communication with other components and/or subsystems associated with the wireless receiver system 30. The receiver controller 38 may be a single controller or may include more than one controller disposed to control various functions and/or features of the wireless receiver system 30. Functionality of the receiver controller 38 may be implemented in hardware and/or software and may rely on one or more data maps relating to the operation of the wireless receiver system 30. To that end, the receiver controller 38 may be operatively associated with the memory 37. The memory may include one or both of internal memory, external memory, and/or remote memory (e.g., a database and/or server operatively connected to the receiver controller 38 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory computer readable memory media.

Further, while particular elements of the receiver control system 36 are illustrated as subcomponents and/or circuits (e.g., the memory 37, the communications system 39, among other contemplated elements) of the receiver control system 36, such components may be external of the receiver controller 38. In some examples, the receiver controller 38 may be and/or include one or more integrated circuits configured to include functional elements of one or both of the receiver controller 38 and the wireless receiver system 30, generally. As used herein, the term "integrated circuits" generally refers to a circuit in which all or some of the circuit elements are inseparably associated and electrically interconnected so that it is considered to be indivisible for the purposes of construction and commerce. Such integrated circuits may include, but are not limited to including, thin-film transistors, thick-film technologies, and/or hybrid integrated circuits.

In some examples, the receiver controller 38 may be a dedicated circuit configured to send and receive data at a given operating frequency. For example, the receiver controller 38 may be a tagging or identifier integrated circuit, such as, but not limited to, an NFC tag and/or labelling integrated circuit. Examples of such NFC tags and/or labelling integrated circuits include the NTAG® family of integrated circuits manufactured by NXP Semiconductors N.V. However, the communications system 39 is certainly not limited to these example components and, in some examples, the communications system 39 may be implemented with another integrated circuit (e.g., integrated with the receiver controller 38), and/or may be another transceiver of or operatively associated with one or both of the electronic device 14 and the wireless receiver system 30, among other contemplated communication systems and/or apparatus. Further, in some examples, functions of the communications system 39 may be integrated with the receiver controller 38, such that the controller modifies the inductive field between the antennas 21, 31 to communicate in the frequency band of wireless power transfer operating frequency.

Figure 10:
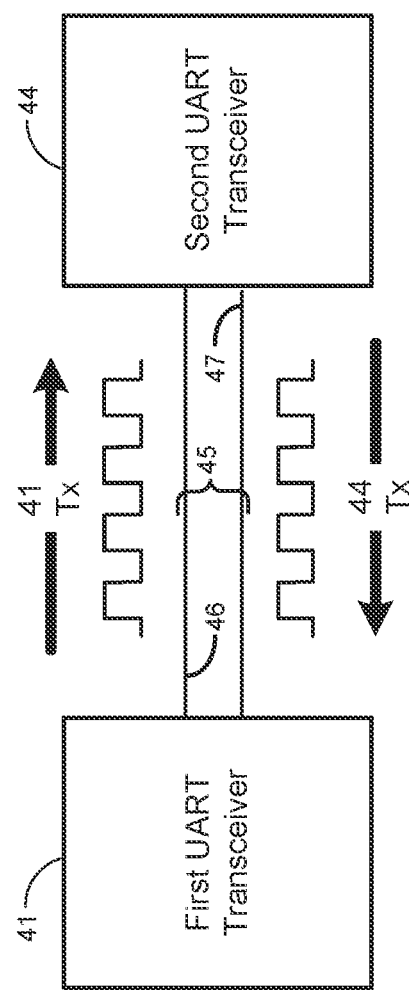
FIG. 10 is schematic functional plot of UART serial wired components overlaid with example communications, by way of background.

Turning to FIG. 10, this figure is a schematic functional plot of physically, electrically connected (e.g., wire connected) two-way data communications components, otherwise known as transceivers, which are overlaid with example communications. The communications between such two-way wired data communication components may include, but are not limited to including, data communications and/or connections compliant with a serial and/or universal asynchronous receiver-transmitter (UART) based protocol; however, such two-way wired data communications, and/or any simulations thereof, are certainly not limited to UART based protocol data communications and/or connections.

UART provides a wired serial connection that utilizes serial data communications over a wired (human-tangible, physical electrical) connection between UART transceivers, which may take the form of a two-wire connection. UART transceivers transmit data over the wired connection asynchronously, i.e., with no synchronizing clock. A transmitting UART transceiver (e.g., a first UART transceiver 41, as illustrated) packetizes the data to be sent and adds start and stop bits to the data packet, defining, respectively, the beginning and end of the data packet for the receiving UART transceiver (e.g., a second UART transceiver 44). In turn, upon detecting a start bit, the receiving UART transceiver 44 reads the incoming bits at a common frequency, such as an agreed baud rate. This agreed baud rate is what allows UART communications to succeed in the absence of a synchronizing clock signal.

In the illustrated example, the first UART transceiver 41 may transmit a multi-bit data sequence (such as is shown in the data diagrams of FIG. 11) to the second UART transceiver 44, via UART communication, and likewise, the second UART transceiver 44 may transmit a multi-bit data element to the first UART transceiver 41. For instance, a UART-encoded signal representing a multi-bit data element may be transmitted over a two-wire connection 45 between the first UART transceiver 41 and the second UART transceiver 44. As shown in the illustrated example, a first wire 46 of the two-wire connection 45 may be used for communication in one direction while a second wire 47 of the two-wire connection 45 may be used for communication in the other direction.

Figure 11:
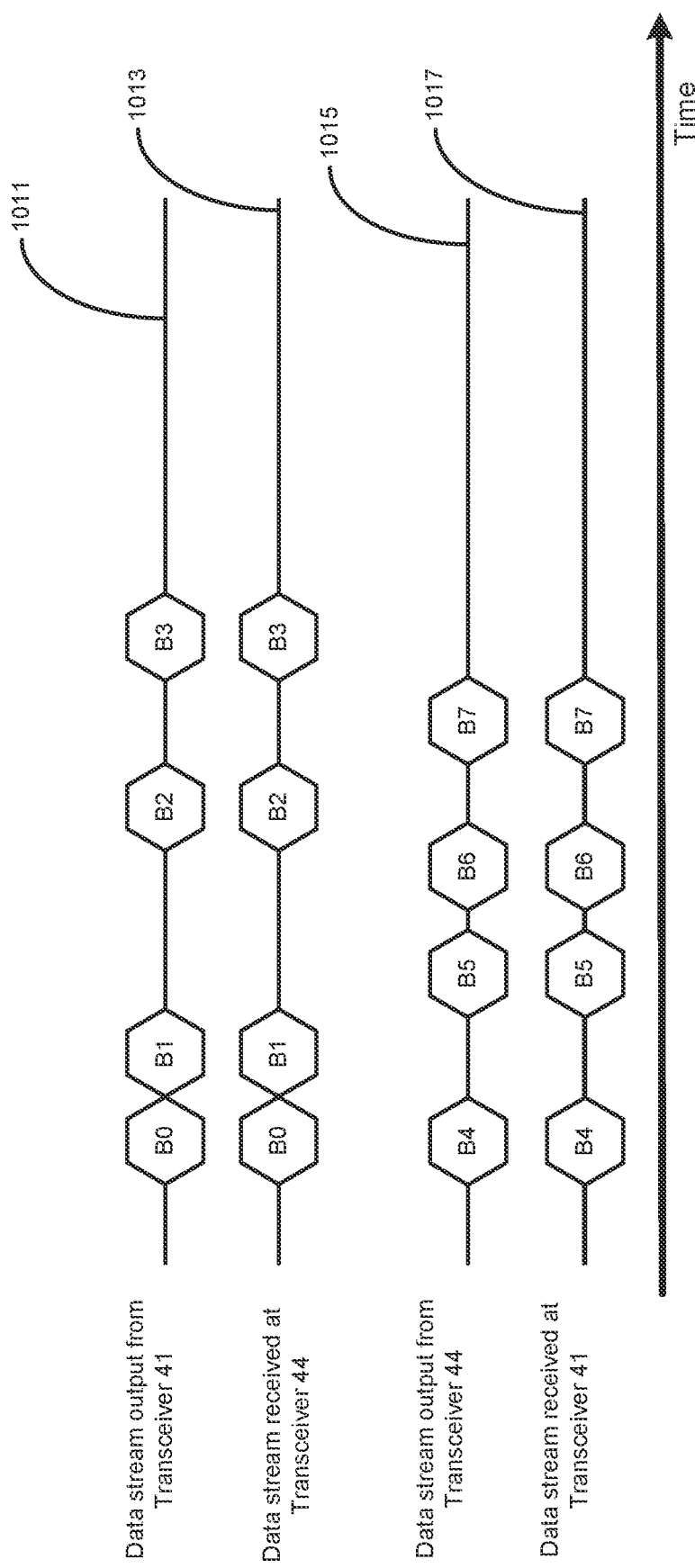
FIG. 11 is timing diagram showing packet communications over UART serial wired communications, by way of background.

FIG. 11 is a timing diagram showing packetized communications of a multi-bit data element over a standard wired UART connection, such as that shown in FIG. 10. In the illustrated example, the first multi-bit data element, for transmission from the first UART transceiver 41 to the second UART transceiver 44, is a first 4-bit number $B_0B_1B_2B_3$. As can be seen, this number is serialized as a single bit stream for transmission and subsequent receipt over the UART connection. The top data stream 1011 shows an example of the serial data stream as output from the first UART transceiver 41, while the second data stream 1013 shows the data stream 1011 as it is then received over the UART connection at transceiver 44. Similarly, the data streams 1015 and 1017 represent the transmission by the second UART transceiver 44 of a second 4-bit number $B_4B_5B_6B_7$ and receipt by the first UART transceiver 41 of that data.

While wired, two-wire, simultaneous two-way communications are a regular means of communication between two devices, it is desired to eliminate the need for such wired connections, while simulating and/or substantially replicating the data transmissions that are achieved today via wired two-way communications, such as, but not limited to serial wired communications that are compliant with UART and/or other data transmission protocols. To that end, FIGS. 12-15 illustrate systems, methods, and/or protocol components utilized to carry out such serial two-way communications wirelessly via the wireless power transfer system 10.

Figure 12:
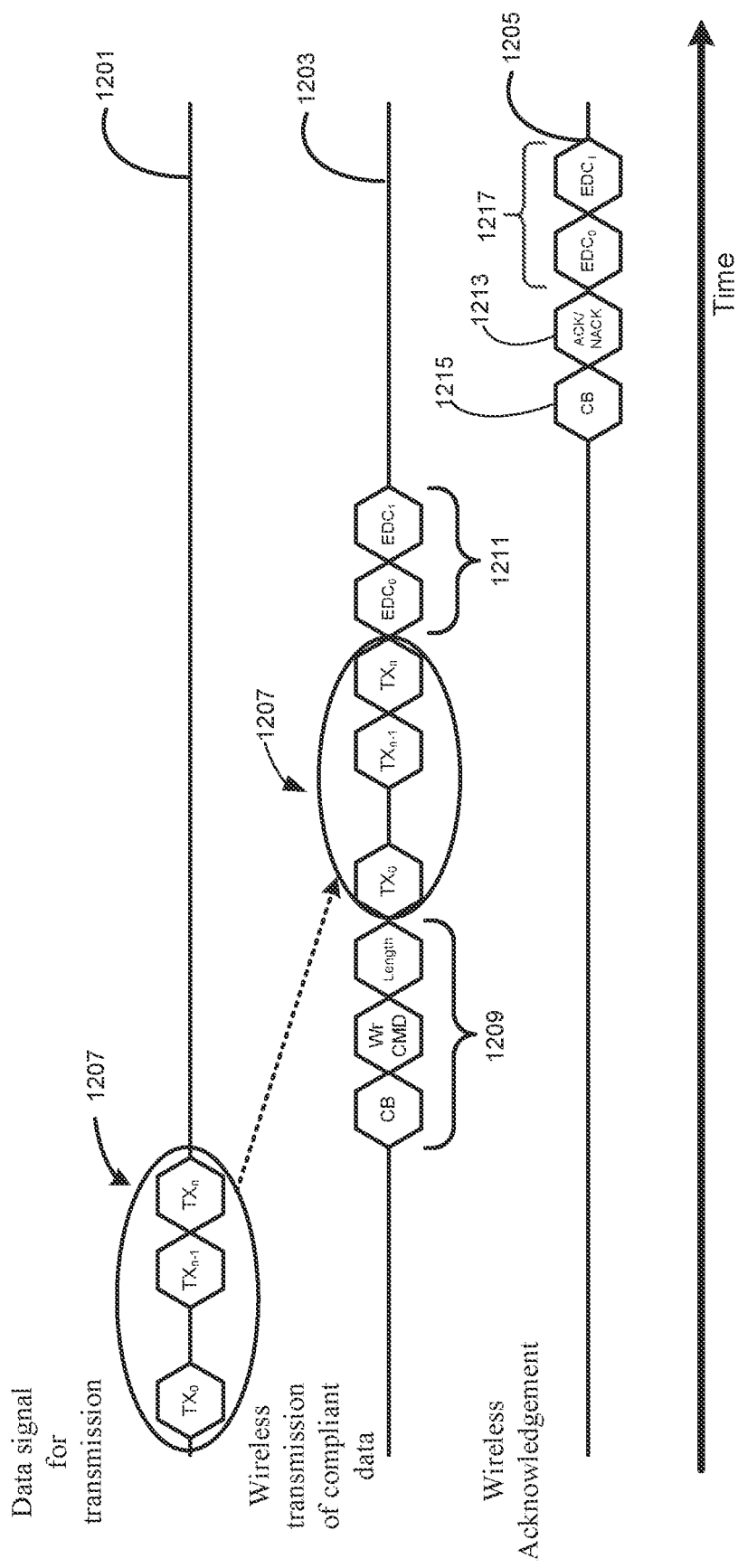
FIG. 12 is a timing diagram showing encapsulation of wirelessly transmitted data, in accordance with the present disclosure.

Turning to FIG. 12, this figure shows a set of a vertically-registered signal timing diagrams associated with a wireless exchange of data and associated communications over a wireless connection, as a function of time, in accordance with the present disclosure. For example, the wireless connection herein may be the magnetic coupling of the transmitter antenna 21 and the receiver antenna 31 of, respectively, the wireless transmission system 20 and the wireless receiver system 30, discussed above. In this situation, the wireless exchange of data occurs between the wireless transmission system 20 and the wireless receiver system 30. It should be noted that data transferred over the wireless connection may be generated, encoded, and/or otherwise provided by one or both of the transmission controller 28 and the receiver controller 38. Such data may be any data, such as, but not limited to, data associated with the wireless transmission of electrical energy, data associated with a host device associated with one of the wireless transmission system 20 or the wireless receiver system 30, or combinations thereof. While illustrated in FIG. 12, along with the proceeding drawings, as a transfer of data from the wireless transmission system 20 to the wireless receiver system 30, as mentioned, the simulated serial communications between the systems 20, 30 may be bidirectional (i.e., two-way), such that both systems 20, 30 are capable of transmission, receipt, encoding, decoding, other bi-directional communications functions, or combinations thereof.

The originating data signal 1201 is an example UART input to the wireless transmission system 20, e.g., as a UART data input to the wireless transmission system 20 and/or the transmission controller 28 and/or as a UART data input to the wireless receiver system 30 and/or the receiver controller 38. While the figure shows the data originating at and transmitted by the wireless transmission system 20/transmission controller 28, the transmission controller 28 and/or the receiver controller 38 may communicate data within the power signal by modulating the inductive field between the antennas 21, 31 to communicate in the frequency band of the wireless power transfer operating frequency.

The wireless serial data signal 1203 in FIG. 12 shows a resultant data stream conveying the data of the originating data signal 1201 as an encapsulated transmission. The acknowledgment signal 1205, shown in FIG. 12, represents a transmission-encapsulated acknowledgment (ACK) or non-acknowledgement (NACK) signal, communicated over the near field magnetic connection, by the receiver controller 38, upon acknowledgment or non-acknowledgement of receipt of the wireless serial data signal 1203, by the receiver controller 38.

Turning to the specific contents of each signal in FIG. 12, the originating data signal 1201 includes an n-byte data element 1207 comprised of bytes $T_{x0} \ldots T_{xn-1}, T_{xn}$. In the wireless serial data signal 1203, the data stream may include a command header 1209 and a checksum 1211, in accordance with the particular transmission protocol in use in the example. "n" indicates any number of bytes for data elements, defined herein. For example, the command header 1209 may include a Control Byte ("CB"), Write command ("Wr CMD") and Length code ("Length"). The Control Byte contains, for example, information required to control data transmission of blocks. The Write command may include information specifying that encapsulated data is to be written at the receiving end. The Length code may include information indicating the length of the n-byte data element 1207. The checksum 1211 may be a datum used for the purpose of detecting errors and may be determined by or generated from a checksum algorithm. The ACK signal 1213 from the receiver is similarly encapsulated between a CB 1215 and a checksum 1217.

Figure 13:
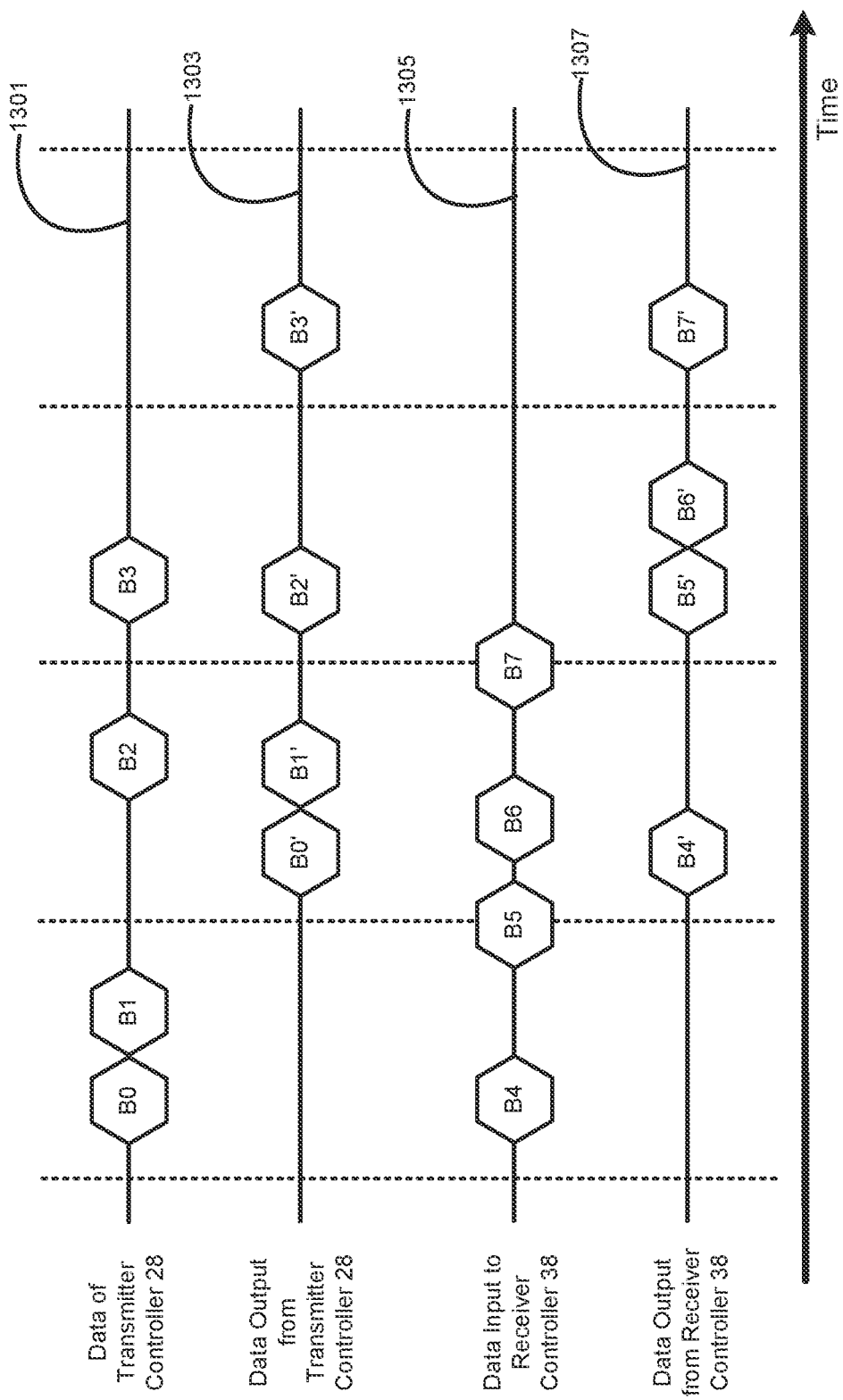
FIG. 13 is a timing diagram showing receiver and transmitter timing functions, in accordance with the present disclosure.

FIG. 13 is a timing diagram showing receiver and transmitter timing functions in accordance with the present disclosure. For example, the receiver timing functions may be the timing of data transmission/receipt at the receiver controller 38 and the transmitter timing functions may be the timing of data transmission/receipt at the transmission controller 28. In this example, the receiver and transmitter timing utilizes a slotted protocol, wherein certain slots of time are available for data transmission, as in-band data communications of the wireless power signal between the transmission antenna 21 and the receiver antenna 31. Utilizing such timing and/or protocol may provide for virtually simultaneous data transfer between the transmission controller 28 and the receiver controller 38, as both the transmission controller 28 and the receiver controller 38 may be capable of altering an amplitude (voltage/current) of the magnetic field between the antennas 21, 31. "Virtually simultaneous data transfer" refers to data transfer which may not be actually simultaneous, but performed at a speed and with such regular switching of active transmitter of data (e.g., the wireless transmission system 20 or the wireless receiver system 30), such that the communications provide a user experience comparable to actual simultaneous data transfer.

In the illustrated embodiment, the first line 1301 shows an incoming stream of bytes $B_0$, $B_1$, $B_2$, $B_3$, to the transmission controller 28. If the transmission controller 28 is configured to transmit data in time slots, then the incoming bytes are slightly delayed and placed into sequential slots as they become available. In other words, data that arrives during a certain time slot (or has any portion arriving during that time slot) will be placed into a subsequent time slot for transmission. This is shown in the second line 1303, which shows data to be transmitted over the wireless link, e.g., a wireless power and data connection. As can be seen, the analog of each byte is sent in the subsequent slot after the data arrives at the transmission controller 28, from, for example, a data source associated with the wireless transmission system 20. Further, a third line 1305 shows an incoming stream of bytes $B_5$, $B_6$, $B_7$, $B_8$, to the receiver controller 38. If the receiver controller 38 is configured to transmit data in time slots, then the incoming bytes are slightly delayed and placed into sequential slots as they become available. In other words, data that arrives during a certain time slot (or has any portion arriving during that time slot) will be placed into a subsequent time slot for transmission. This is shown in the fourth line 1307, which shows data to be transmitted over the wireless link, e.g., a wireless power and data link. As can be seen, the analog of each byte is sent in the subsequent slot after the data arrives at the receiver controller 38 from, for example, a data source associated with the wireless receiver system 30.

In a buffered system, communications can be held in one or more buffers until the subsequent processing element is ready for communications. To that end, if one side is attempting to pass a large amount of data but the other side has no need to send data, communications can be accelerated since they can be sent "one way" over the virtual "wire" created by the inductive connection. Therefore, while such electromagnetic communications are not literally "two-way" communications utilizing two wires, virtual two-way UART communications are executable over the single inductive connection between the transmitter and receiver.

Figure 14A:
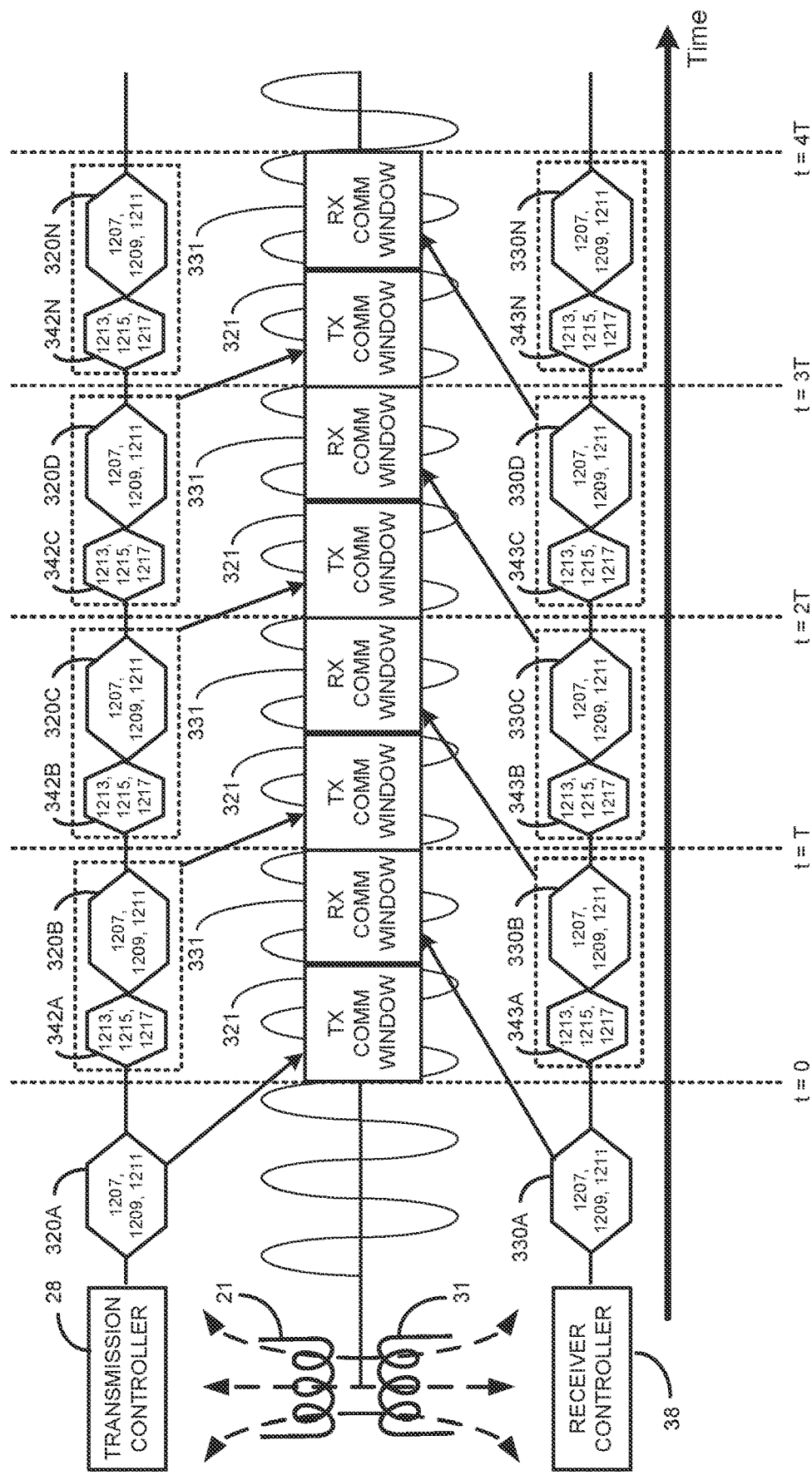
FIG. 14A is a timing diagram showing windowing of communications, when both the wireless transmission system and the wireless receiver system are communicating with virtual two-way communications, in accordance with the present disclosure.
Figure 14B:
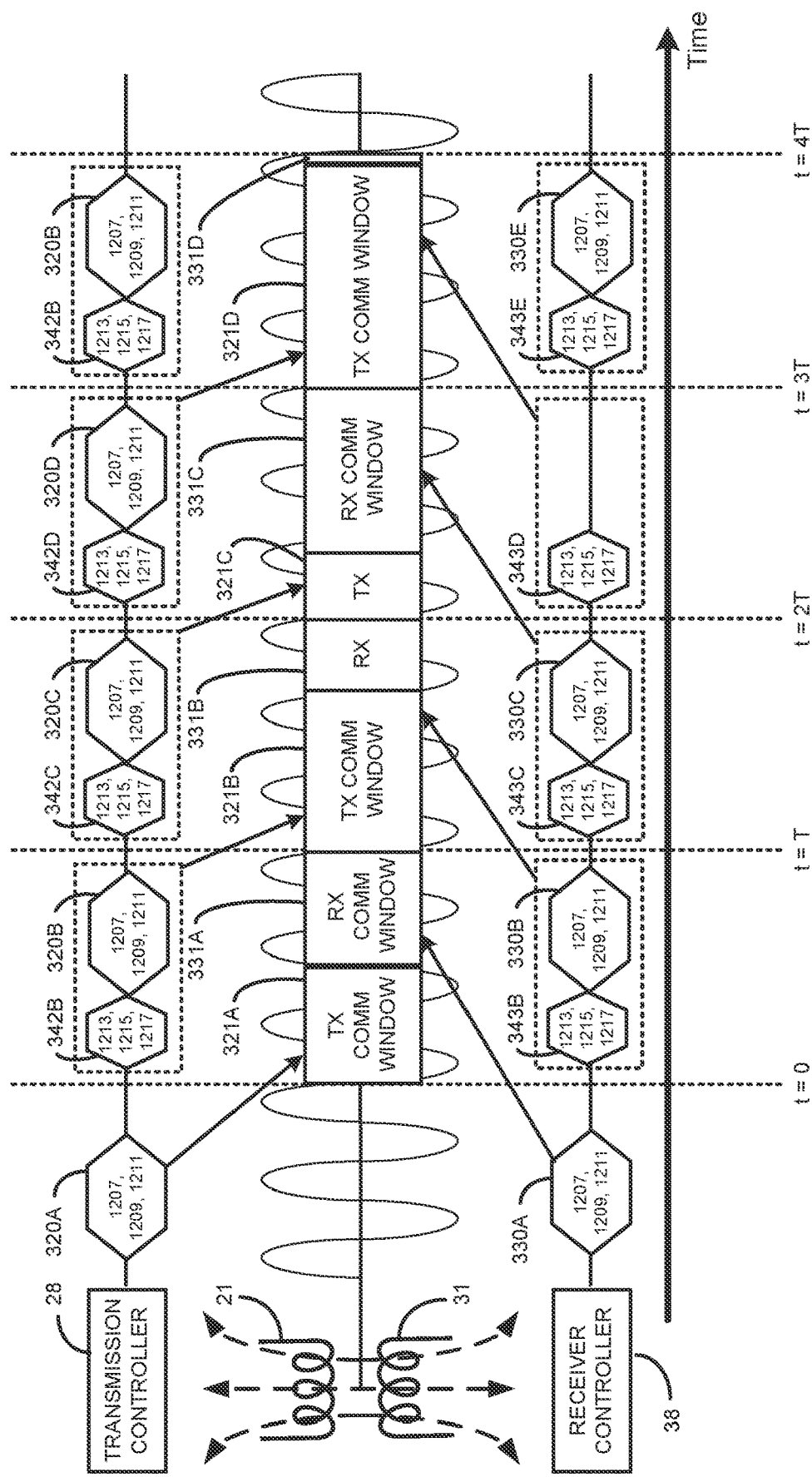
FIG. 14B is a timing diagram showing variable-length windowing of communications, when both the wireless transmission system and the wireless receiver system are communicating with virtual two-way communications, in accordance with the present disclosure.

To that end, as illustrated in FIGS. 14A-14B, two-way communications may be achieved by windowing a period of time, within which each of the wireless transmission system 20 and the wireless receiver system 30 encode their data into the power signal/magnetic field emanating between the antennas 21, 31. FIG. 14A shows a timing diagram, wherein data 320, 330 at the systems 20, 30, respectively, are prepared for transmission and subsequently encoded into the signal during respective transmission communication windows 321 and receiver communication windows 331. As illustrated, the systems 20, 30 and/or controllers 28, 38 may be configured to store, transmit, and encode data 320, 330 into the resultant signal emanating between the antennas 21, 31. Such controllers 28, 38 may be configured to encode said data 320, 330 within the windows 321, 331, within a given and known (by both controllers 28, 38) period of time (T). As such, the time scale in FIG. 14 is labelled with recurring periods for the time, as indicated by the vertical dotted lines. Further, while the windows 321, 331 are illustrated as consuming entire periods T of the signal, the windows 321, 331 do not necessarily consume an entire period T and may be configured as a fraction of the period T, but recurring and beginning at intervals of the period T.

Each of the transmission controller 28 and the receiver controller 38 may be configured to transmit a stream of the data 320A-N, 330A-N, respectively, to the other controller 28, 38, in a sequential manner and within the respective windows 321, 331. The period T and/or the windows 321, 331 may be of any time length suitable for the data communications operation used. However, it may be beneficial to have short periods and windows, such that the switching of senders (controllers 28, 38) is not perceptible by the user of the system. Thus, to achieve high data rates with short windows and periods, the power signal may be of a high operating frequency (e.g., in a range of about 1 MHz to about 20 MHz). To that end, the data rates utilized may be up to or exceeding about 1 megabit per second (Mbps) and, thus, small periods and windows therein are achievable.

Further, while the windows in FIG. 14A are illustrated as relatively equal, such window sizes may not be equal. For example, as illustrated in FIG. 14B, the length of the windows 321, 331 may dynamically alter based on, for example, the desired data operations needed. Thus, the length of the windows 321, 331 within each slot may lengthen or shrink, with respect to one another, based on operating conditions. For example, as illustrated at windows 321B, 331B, the transmission communications window 321B may be significantly larger than the receiver communications window 331B. Such a configuration may be advantageous when the transmission system 20 desires to send a large amount of data (e.g., a firmware update, new software for the electronic device 14, among other software and/or firmware), while the receiver system 30 only needs to transmit regular wireless power related information.

Conversely, in some examples, such as those of illustrated by windows 321C, 331C, the receiver system 30 may need to send much more data than the transmission system 20 and, thus, the windows 321C, 331C are dynamically altered such that the receiver communications window 331C is larger, with respect to the transmission communications window. Such a configuration may be advantageous when the receiver system desires to send a large amount of data to the transmission system 20 and/or a device associated therewith. Example situations wherein this scenario may exist include, but are not limited to including, download of device data from the wireless receiver system 30 to a device associated with the wireless transmission system 20.

In an example exemplified by the windows 321D, 331D, the transmission communications window 321D may be so much larger than the receiver communications window 331D, such that the receiver communications window 331D, virtually, does not exist. Thus, this may put the transmissions system 20 in a virtual one-way data transfer, wherein the only data transmitted back to the transmission system 20 is a simple ACK signal 1213 and, in some examples, associated data such as the CB 1215 and/or checksum 1217. Such a configuration may be advantageous when the transmission system 20 is transmitting data and the receiver system 30 does not need to receive significant electrical power to charge the load 16 (e.g., when the load 16 is at a full load or fully charged state and, thus, the receiver system 30 may not need to send much power-related data).

In some examples, as illustrated, some data 320, 330 may be preceded by acknowledgment data 342, 343, which includes, but is not limited to including, at least the ACK signal 1213 and, in some examples, may further include a CB 1215 and/or a checksum 1217, each of which are discussed in more detail above. The acknowledgement data 342, 343 may be associated with an acknowledgement of receipt of a previously transmitted member of the stream of data 320A-N, 330A-N, within a subsequent window of the previously transmitted member of the stream of data 320A-N, 330A-N. For example, consider that in a first transmission communication window 321, a first data 320A is encoded and transmitted during the first period of time [t=0:T]. Then, a receiver acknowledgment data 343A will be encoded and transmitted, by the receiver controller 38, within a second receiver communications window 331, during a second period of time [t=T:2T].

Therefore, by encoding the data 320, 330, 342, 343 sequentially and within timed, alternating windows in the power signal of the antennas 21, 31, this may make the alternation of data passage nearly unnoticeable, and, thus, the communications are virtually simultaneously two-way, as the user experience does not register as alternating senders.

Figure 15:
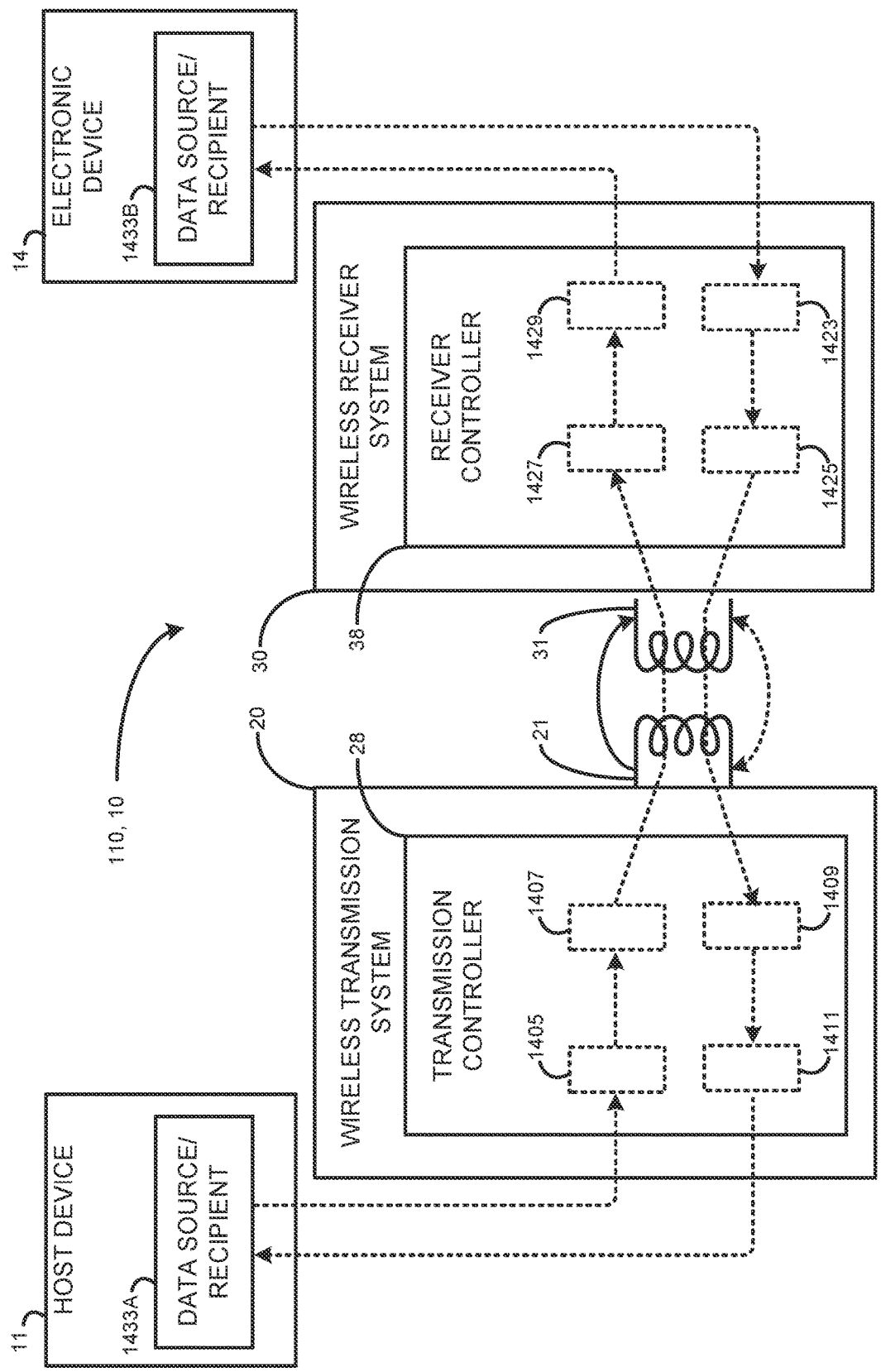
FIG. 15 is a schematic diagram of a system segment for buffering data communication for transmission and receipt via near-field magnetic coupling, in accordance with the present disclosure.

FIG. 15 is a schematic diagram 110 of a one or more components of the wireless power transfer system 10, including the transmission controller 28 and the receiver controller 38 of, respectively, the wireless transmission system 20 and the wireless receiver system 30. The diagram 110 illustrates a configuration of the system 10 capable of buffering data in order to facilitate virtual two-way communications. The transmission controller 28 may receive data from a first data source/recipient 1433A associated with the wireless transmission system 20; however, it is certainly contemplated that the source of the data for the transmission controller 28 is the transmission controller 28 and/or any data collecting/providing elements of the wireless transmission system 20, itself. The data source/recipient 1433A may be operatively associated with a host device 11 that hosts or otherwise utilizes the wireless transmission system 20. Data provided by the data source/recipient 1433A may be processed by the transmission controller 28, transmitted from the transmission antenna 21 to the receiver antenna 31, processed by the receiver controller 38, and, ultimately, received by a second data source/recipient 1433B.

The second data source/recipient 1433B may be associated with the electronic device 14, which hosts or otherwise utilizes the wireless receiver system 30. The receiver controller 38 may receive data from a first data source/recipient 1433B associated with the wireless receiver system 30; however, it is certainly contemplated that the source of the data for the receiver controller 38 is the receiver controller 38 and/or any data collecting/providing elements of the wireless receiver system 30 itself. The data source/recipient 1433B may be operatively associated with an electronic device 14 that hosts or otherwise utilizes the wireless receiver system 30. Data provided by the data source/recipient 1433B may be processed by the receiver controller 38, transmitted over the field generated by the connection between the transmission antenna 21 and the receiver antenna 31, processed by the transmission controller 28, and, ultimately, received by a second data source/recipient 1433A. The second data source/recipient 1433A may be associated with the host device 11, which hosts or otherwise utilizes the wireless transmission system 20.

As shown, the illustrated example includes a series of buffers 1405, 1407, 1409, 1411, 1423, 1425, 1427, 1429, each associated with one of the transmission controller 28 or the receiver controller 38. The buffers 1405, 1407, 1409, 1411, 1423, 1425, 1427, 1429 may be used to properly order the data for transmission and receipt, especially when the communication between the wireless transmission system 20 and wireless receiver system 30 includes data of a type typically associated with a two-wire, physical, serialized data communications system, such as the UART transceivers of FIG. 10. In an embodiment, the output of the one or more buffers 1405, 1407, 1409, 1411, 1423, 1425, 1427, 1429 in the wireless power transmission system is clocked to trigger buffered data for transmission, meaning that the controller 28, 38 may be configured to output the buffered data at a regular, repeating, clocked timing In the illustrated example, the transmission controller 28 includes two outgoing buffers 1405, 1407 to buffer outgoing communications, as well as two incoming buffers 1409, 1411 to buffer incoming communications. Similarly, the receiver controller 28 includes two incoming buffers 1429, 1427 to buffer incoming communications and two outgoing buffers 1423, 1425 to buffer outgoing communications.

The purpose of these two-buffer sets, in an embodiment, is to manage overflow by mirroring the first buffer in the chain to the second when full, allowing the accumulation of subsequent data in the now-cleared first buffer. Thus, for example, data entering buffer 1405 from data source 1433A is accumulated until buffer 1405 is full or reaches some predetermined level of capacity. At that point, the accumulated data is transferred into buffer 1407 so that buffer 1405 can again accumulate data coming from the data source 1433A. Similarly, for example, data entering buffer 1423 from data source 1433B is accumulated until buffer 1423 is full or reaches some predetermined level of capacity. At that point, the accumulated data is transferred into buffer 1425 so that buffer 1423 can again accumulate data coming from the data source 1433B. While the two-buffer sets are used in this illustration, by way of example, it will be appreciated that single buffers may be used or, alternatively, three-buffer or larger buffer sets may be used. Similarly, the manner of using the illustrated two-buffer sets is not necessary in every embodiment, and other accumulation schemes may be used instead.

Figure 16:
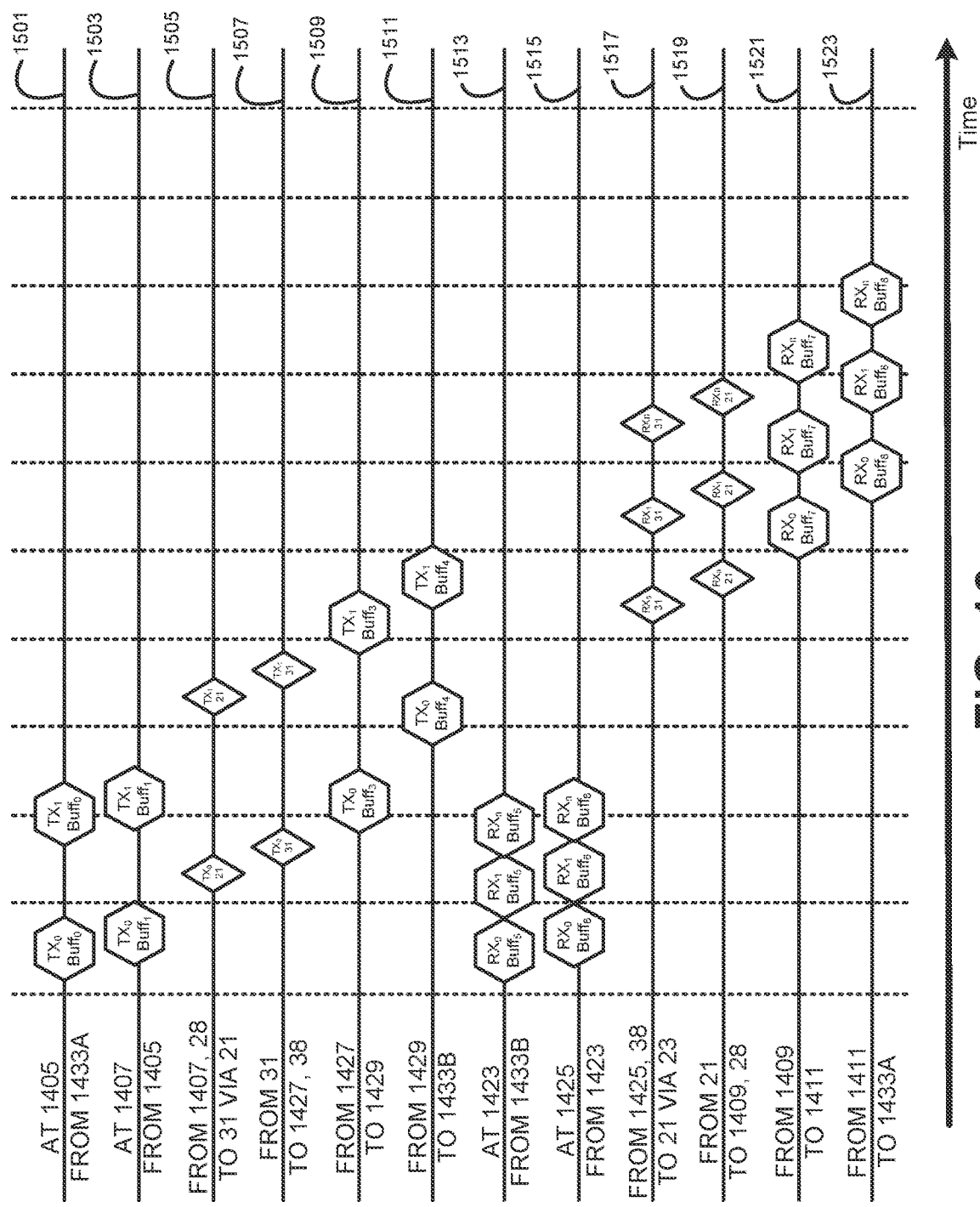
FIG. 16 is a set of vertically-registered timing diagrams reflecting buffered data communications, in accordance with the present disclosure.

FIG. 16 is a timing diagram showing initial data input (lines 1501, 1513), buffering (lines 1501, 1503, 1513, 1515), and wireless transmission (lines 1505, 1507, 1517, 1519), as well as receipt (line 1509, 1521), buffering (line 1509, 1511, 1521, 1523), and data output (line 1511, 1523) in the context of a configuration, such as that shown in FIG. 14. The first three lines of each data transfer (lines 1501, 1503, 1505, 1511, 1513, 1515) show a series of data transfers for sending asynchronous incoming data such as UART data across a wireless connection. The last three lines of each data transfer (1507, 1509, 1511, 1519, 1521, 1523) show the receipt and processing of embedded data in a wireless transmission.

As can be seen, the data stream in the first two lines 1501, 1503, represent incoming data received and buffered at the transmission controller 28. The buffered data is then transmitted within the prescribed wireless data slots 1513n in line 1505, which may, for example, cover a very small portion of the transmission bandwidth. Note, that the wireless data slots 1513n have no bearing on the timing of data receipt/internal transfer within the controllers 28, 38, but may be utilized for timing the modulation of the induced field between the antennas 21, 31 that is utilized for transmission of data.

In the non-limiting example of FIG. 16, line 1501 shows a series of data packets from the transmission system 20 ($TX_0 \ldots TX_n$) sequentially input to a first outgoing buffer 1405 ($Buff_0$). Then, prior to transmission via the transmitter antenna 21, the series of data packets ($TX_0 \ldots TX_n$) are input to the second outgoing buffer 1407 ($Buff_1$), as illustrated in line 1503. Then, the transmission controller 21 sequentially encodes the series of data packets ($TX_0 \ldots TX_n$) into the driving signal for the transmitter antenna 21 (line 1505) which is then received and/or detected in the magnetic field between the antennas antenna 21, 31, at the wireless receiver system 30 (line 1507).

As noted above, the last three lines 1507, 1509, 1511 show the receipt and processing of embedded data in the wireless transmission, and in particular show wireless receipt of the data (1507), buffering of the received data (1509, 1511) and outputting of the buffered data (1511). Again, the output of the one or more buffers in the wireless power transmission system may be clocked to trigger buffered data for transmission.

In the non-limiting example of FIG. 16, line 1507 shows a series of data packets originating from the transmission system 20 ($TX_0 \ldots TX_n$) and received at the receiver antenna 31 sequentially input to a first input buffer 1427 ($Buff_3$) of the receiver controller 38, upon sequential decoding of the series of data packets ($TX_0 \ldots TX_n$) by the receiver controller 38 detection of the magnetic field between antennas 21, 31. Then, prior to output of the data to the data recipient 1433B, the series of data packets ($TX_0 \ldots TX_n$) are input to a second input buffer 1429 ($Buff_4$) from the first input buffer ($Buff_3$), as illustrated in line 1511.

In the non-limiting example of FIG. 15, line 1501 shows a series of data packets ($RX_0 \ldots RX_n$) sequentially input to a first outgoing buffer 1423 ($Buff_0$). Then, prior to transmission via altering the field between the receiver antenna 31 and the transmitter antenna 21, the series of data packets ($RX_0 \ldots RX_n$) are input to the second outgoing buffer 1425 ($Buff_1$), as illustrated in line 1503. Then, the receiver controller 38 sequentially encodes the series of data packets ($RX_0 \ldots RX_n$) into in band of the wireless power transfer between the antennas 21, 31 (line 1505), the signal is then received and/or detected in the magnetic field between the antennas antenna 21, 31, at the wireless transmission system 20 (line 1507).

As noted above, the lines 1507, 1509, 1511 show the receipt and processing of embedded data in the wireless transmission, and in particular show wireless receipt of the data (1507), buffering of the received data (1509, 1511) and outputting of the buffered data (1511). Again, the output of the one or more buffers in the wireless power transmission system may be clocked to trigger buffered data for transmission.

As can be seen, the data stream in the lines 1513, 1515 represent incoming data received and buffered at the receiver controller 38. The buffered data is then transmitted within the prescribed wireless data slots 1513n in line 1517, which may, for example, cover a very small portion of the transmission bandwidth. Note, that the wireless data slots 1513n have no bearing on the timing of data receipt/internal transfer within the controllers 28, 38, but may be utilized for timing the modulation of the induced field between the antennas 21, 31 that is utilized for transmission of data.

In the non-limiting example of FIG. 16, line 1513 shows a series of data packets ($RX_0 \ldots RX_n$) originating at the receiver system 30 and sequentially input to a third outgoing buffer 1423 ($Buff_5$). Then, prior to transmission via altering the field between the receiver antenna 31 and the transmitter antenna 21, the series of data packets ($RX_0 \ldots RX_n$) are input to the fourth outgoing buffer 1425 ($Buff_6$), as illustrated in line 1515. Then, the receiver controller 38 sequentially encodes the series of data packets ($RX_0 \ldots RX_n$) in band of the wireless power transfer between the antennas 21, 31 (line 1517), the signal is then received and/or detected in the magnetic field between the antennas antenna 21, 31, at the wireless transmission system 20 (line 1519).

As noted above, the three lines 1519, 1521, 1523 show the receipt and processing of embedded data in the wireless transmission, and in particular show wireless receipt of the data (1519), buffering of the received data (1521, 1523) and outputting of the buffered data (1523). Again, the output of the one or more buffers in the wireless power transmission system may be clocked to trigger buffered data for transmission.

In the non-limiting example of FIG. 16, line 1519 shows the series of data packets ($RX_0 \ldots RX_n$) sequentially input to a third input buffer 1409 ($Buff_7$) of the transmission controller 28, upon sequential decoding of the series of data packets ($RX_0 \ldots RX_n$) by the transmission controller 28 detection of the magnetic field between antennas 21, 31. Then, prior to output of the data to the data recipient 1433A, the series of data packets ($RX_0 \ldots RX_n$) are input to a fourth input buffer 1411 ($Buff_8$) from the third input buffer ($Buff_7$), as illustrated in line 1523.

As best illustrated in FIG. 14, by utilizing the buffers and the ability of both the transmission controller 28 and the receiver controller 38 to encode data into the wireless power signal transmitted over the connection between the antennas 21, 31, such combinations of hardware and software may simulate the two-wire connections (FIGS. 10, 11), depicted as dotted, arrowed lines in FIG. 14. Thus, the systems and methods disclosed herein may be implemented to provide a "virtual wired" serial and/or "virtual wired" UART data communications system, method, or protocol, for data transfer between the wireless transmission system 20 and the wireless receiver system 30 and/or between the host devices thereof. "Virtual wired," as defined herein, refers to a wireless data connection, between two devices, that simulates the functions of a wired connection and may be utilized in lieu of said wired connection.

In contrast to the wired serial data transmission systems such as UART, as discussed in reference to FIGS. 10 and 11, the systems and methods disclosed herein eliminate the need for a wired connection between communicating devices, while enabling a data communication interpretable by legacy systems that utilize known data protocols, such as UART. Further, in some examples, such legacy-compatible systems may enable manufacturers to quickly introduce wireless data and/or power connections between devices, without needing to fully reprogram their data protocols and/or without having to hinder interoperability between devices.

Additionally or alternatively, such systems and methods for data communications, when utilized as part of a combined wireless power and wireless data system, may provide for much faster legacy data communications across an inductive wireless power connection, in comparison to legacy systems and methods for in-band communications.

Figure 17:
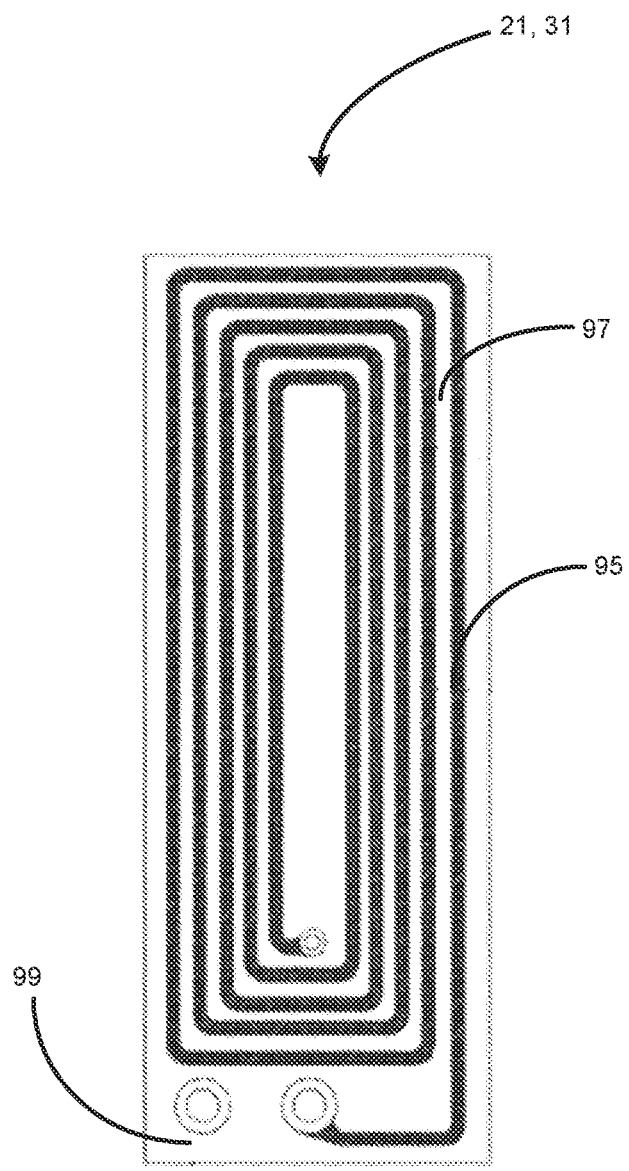
FIG. 17 is a top view of a non-limiting, exemplary antenna, for use as one or both of a transmission antenna and a receiver antenna of the systems, methods, or apparatus disclosed herein, in accordance with the present disclosure.

FIG. 17 illustrates an example, non-limiting embodiment of one or more of the transmission antenna 21 and the receiver antenna 31 that may be used with any of the systems, methods, and/or apparatus disclosed herein. In the illustrated embodiment, the antenna 21, 31, is a flat spiral coil configuration. Non-limiting examples can be found in U.S. Pat. Nos. 9,941,743, 9,960,628, 9,941,743 all to Peralta et al.; U.S. Pat. Nos. 9,948,129, 10,063,100 to Singh et al.; U.S. Pat. No. 9,941,590 to Luzinski; U.S. Pat. No. 9,960,629 to Rajagopalan et al.; and U.S. Patent App. Nos. 2017/0040107, 2017/0040105, 2017/0040688 to Peralta et al.; all of which are assigned to the assignee of the present application and incorporated fully herein by reference.

In addition, the antenna 21, 31 may be constructed having a multi-layer-multi-turn (MLMT) construction in which at least one insulator is positioned between a plurality of conductors. Non-limiting examples of antennas having an MLMT construction that may be incorporated within the wireless transmission system(s) 20 and/or the wireless receiver system(s) 30 may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, and 9,300,046 to Singh et al., all of which are assigned to the assignee of the present application are incorporated fully herein. These are merely exemplary antenna examples; however, it is contemplated that the antennas 21, 31 may be any antenna capable of the aforementioned higher power, high frequency wireless power transfer.

With respect to any of the data transmission systems disclosed herein, it should be appreciated that either or both of the wireless power sender and the wireless power receiver may wirelessly send in-band legacy data. Moreover, the systems, methods, and apparatus disclosed herein are designed to operate in an efficient, stable and reliable manner to satisfy a variety of operating and environmental conditions. The systems, methods, and/or apparatus disclosed herein are designed to operate in a wide range of thermal and mechanical stress environments so that data and/or electrical energy is transmitted efficiently and with minimal loss. In addition, the system 10 may be designed with a small form factor using a fabrication technology that allows for scalability, and at a cost that is amenable to developers and adopters. In addition, the systems, methods, and apparatus disclosed herein may be designed to operate over a wide range of frequencies to meet the requirements of a wide range of applications.

In an embodiment, a ferrite shield may be incorporated within the antenna structure to improve antenna performance. Selection of the ferrite shield material may be dependent on the operating frequency as the complex magnetic permeability ($\mu=\mu'-j*\mu''$) is frequency dependent. The material may be a polymer, a sintered flexible ferrite sheet, a rigid shield, or a hybrid shield, wherein the hybrid shield comprises a rigid portion and a flexible portion. Additionally, the magnetic shield may be composed of varying material compositions. Examples of materials may include, but are not limited to, zinc comprising ferrite materials such as manganese-zinc, nickel-zinc, copper-zinc, magnesium-zinc, and combinations thereof.

Figure 18:
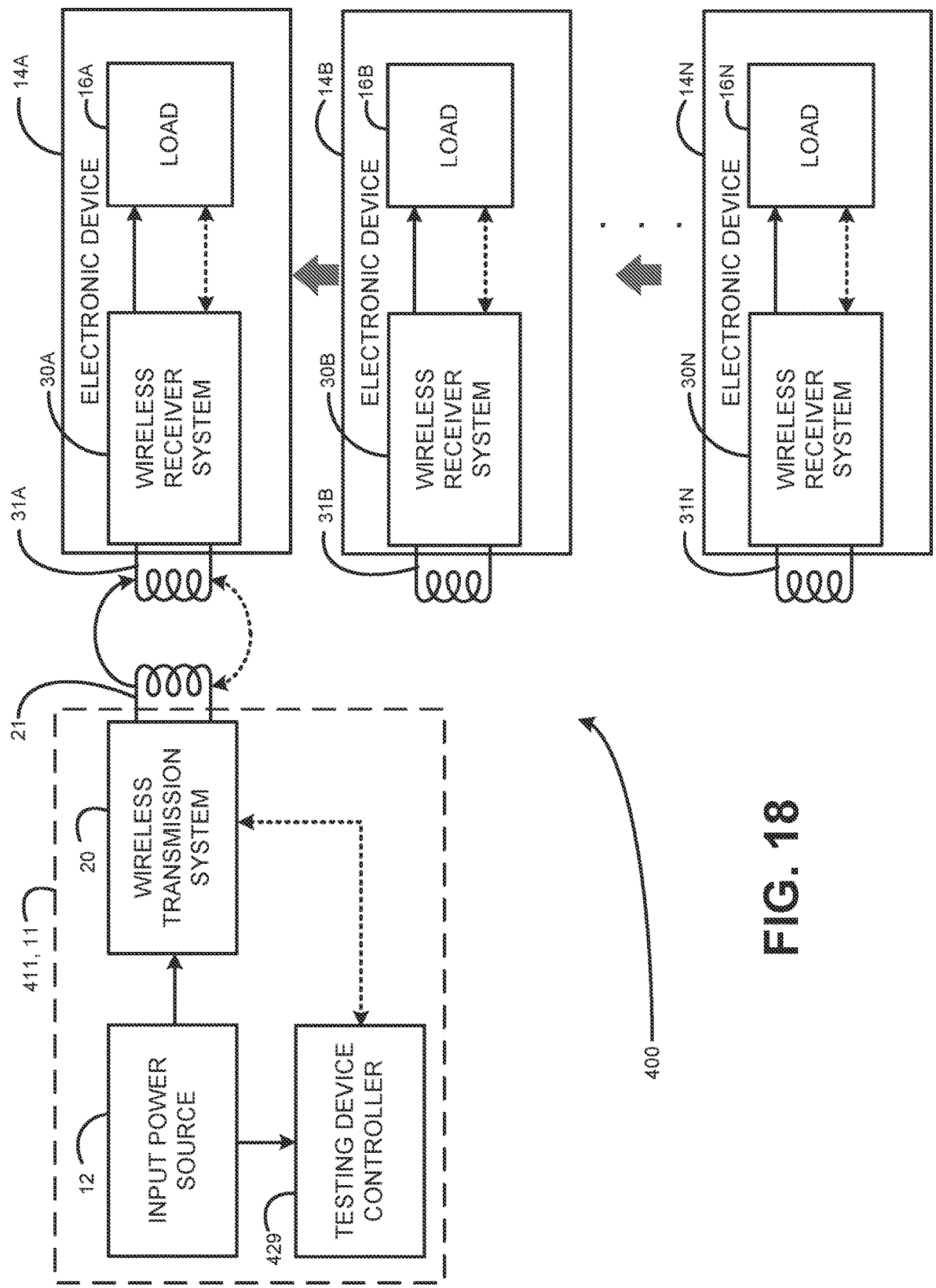
FIG. 18 is a block diagram of a testing device, utilizing the wireless power transmission system of FIGS. 1-17, for testing a plurality of electronic devices, in accordance with the present disclosure.

FIG. 18 is a block diagram for a testing device 411, which may be the host device 11 and utilize the wireless transmission system 20, situated within a test environment 400 for testing a plurality of electronic devices 14A-N. The testing device 411 is used either during or after manufacture of the electronic devices 14A-N, to ensure proper operation of the electronic devices 14A-N. The wireless transmission system 20 is utilized by the testing device 411 for communicating with electronic devices 14A-N, for the purposes of testing.

The testing device 411 may include or be otherwise operatively associated with a testing device controller 429. The testing device controller 429 may be utilized to generate testing signals for transmission to at least one of the plurality of electronic devices 14A-N and, in response to the testing signals, receive testing data from the electronic device 14A-N, via interface with the electronic devices 14A-N by the wireless transmission system 20. The wireless transmission system 20 may receive the testing signals from the testing device controller 429, convert the testing signals into transmittable data, in accordance with the protocols discussed above, over the connection between the systems 20, 30, receive data signals, in accordance with the protocols discussed above, over the connection between the systems 20, 30, and output the received testing data to the testing device controller 429.

The testing signals may be any prompt for testing a characteristic of the electronic device 14 and/or any component thereof and the testing data may be any data in response to the prompt of a testing signal and associated with the same characteristic of the electronic device 14. Example characteristics include, but are not limited to including, charge time over a wireless power connection, communications speed, data rate, communications failure rate, start up time, start up failure frequency, data associated with sensors of the electronic device 14, data associated with one or more controllers of the electronic device 14, system data of the electronic device, among other characteristics associated with the electronic device 14. In an example, the testing signals may be configured for testing a charge time for the load 16 of the electronic device 14; in such examples, the testing data includes charge time data rate. In another example, the testing signals are configured for testing communications failure rate; in such examples, the testing data includes communications failure rate data. In yet another example, the testing signals are configured for testing electronic device start up and the testing data includes electronic device start up data, which may include, but is not limited to including, failure rate data and/or start up duration data.

The testing controller 429 may be any electronic controller or computing system that includes, at least, a processor which performs operations, executes control algorithms, stores data, retrieves data, gathers data, controls and/or provides communication with other components and/or subsystems associated with the testing device 411, and/or performs any other computing or controlling task desired. The testing device 411 may be a single controller or may include more than one controller disposed to control various functions and/or features of the testing device 411. Functionality of the testing controller 429 may be implemented in hardware and/or software and may rely on one or more data maps relating to the operation of the testing device 411. To that end, the testing controller 429 may be operatively associated memory. The memory may include one or more of internal memory, external memory, and/or remote memory (e.g., a database and/or server operatively connected to the testing controller 429 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory machine readable and/or computer readable memory media.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub combination. As a further example, it will be appreciated that although UART and the NFC protocols are used as specific example communications schemes herein, other wired and wireless communications techniques may be used where appropriate while embodying the principles of the present disclosure.

The invention claimed is:

1. A testing device for testing wireless power receiver systems in electronic devices, the testing device comprising:
 a transmitter antenna configured to:
  couple with one or more receiver antennas of at least one of the wireless power receiver systems, and
  transmit alternating current (AC) wireless signals to the one or more receiver antennas; and
 at least one controller comprising:
  at least one processor,
  at least one non-transitory machine-readable medium, and
  program instructions stored on the at least one non-transitory machine-readable medium that are executable by the at least one processor such that the at least one controller is configured to:
   (i) generate testing signals for transmission to at least one of the electronic devices,
   (ii) provide a driving signal for driving the transmitter antenna, based on an operating frequency for the transmitter antenna, such that the transmitter antenna emits a transmission in accordance with the driving signal, wherein the driving signal is configured to generate a power signal and a first asynchronous serial data signal in accordance with a wireless power and data transfer protocol, the first asynchronous serial data signal based on the testing signals,
(iii) receive testing data, in response to the testing signals,
(iv) decode the power signal to extract a second data signal compliant with the wireless power and data transfer protocol, and
(v) decode the second data signal compliant with the wireless power and data transfer protocol to extract a second asynchronous serial data signal, the second asynchronous serial data signal based on the testing data.

2. The testing device of claim 1, wherein the testing signals are configured for testing a charge time for a load of at least one of the electronic devices, and
wherein the testing data includes charge time data.

3. The testing device of claim 1, wherein the testing signals are configured for testing communications failure rate, and
wherein the testing data includes communications failure rate data.

4. The testing device of claim 1, wherein the testing signals are configured for testing electronic device start up, and
wherein the testing data includes electronic device start up data.

5. The testing device of claim 1, wherein the first and second asynchronous serial data signals are, respectively, first and second universal asynchronous receiver-transmitter (UART) compliant data signals, and wherein the wireless power and data transfer protocol is a Near Field Communication (NFC) protocol.

6. The testing device of claim 5, wherein the program instructions stored on the at least one non-transitory machine-readable medium further include instructions that are executable by the at least one controller such that the at least one controller is further configured to generate the first and second UART compliant data signals in accordance with the NFC data transfer protocol by packetizing the first and second UART compliant data signals in a synchronous NFC data stream having a header with a synchronizing command and length command.

7. The testing device of claim 5, wherein the program instructions stored on the at least one non-transitory machine-readable medium further include instructions that are executable by the at least one controller such that the at least one controller is further configured to generate the first and second UART compliant data signals in accordance with the NFC data transfer protocol by including at least one error check element after the first and second UART compliant data signals.

8. The testing device of claim 7, wherein the program instructions stored on the at least one non-transitory machine-readable medium further include instructions that are executable by the at least one controller such that the at least one controller is further configured to generate an acknowledgement (ACK) response to be transmitted when processing of the at least one error check element indicates errorless receipt of the first and second UART compliant data signals.

9. The testing device of claim 7, wherein the program instructions stored on the at least one non-transitory machine-readable medium further include instructions that are executable by the at least one controller such that the at least one controller is further configured to generate a negative acknowledgement response (NACK) to be transmitted when processing of the at least one error check element indicates erroneous receipt of a UART compliant data signal from the first and second UART compliant data signals.

10. At least one non-transitory, machine-readable medium wherein the at least one non-transitory machine-readable medium is provisioned with program instructions that, when executed by at least one processor, cause at least one controller to:
generate testing signals for transmission to at least one electronic device under test by a testing device,
provide a driving signal for driving a transmitter antenna of the testing device, based on an operating frequency for the transmitter antenna, such that the transmitter antenna emits a transmission in accordance with the driving signal, wherein the driving signal is configured to generate a power signal and a first asynchronous serial data signal in accordance with a wireless power and data transfer protocol, the first asynchronous serial data signal based on the testing signals,
receive testing data, in response to the testing signals,
decode the power signal to extract a second data signal compliant with the wireless power and data transfer protocol, and
decode the second data signal compliant with the wireless power and data transfer protocol to extract a second asynchronous serial data signal, the second asynchronous serial data signal based on the testing data.

11. The at least one non-transitory, machine-readable medium of claim 10, wherein the testing signals are configured for testing a charge time for a load of the at least one electronic device under test, and wherein the testing data includes charge time data.

12. The at least one non-transitory, machine-readable medium of claim 10, wherein the testing signals are configured for testing communications failure rate, and
wherein the testing data includes communications failure rate data.

13. The at least one non-transitory, machine-readable medium of claim 10, wherein the testing signals are configured for testing electronic device start up, and
wherein the testing data includes electronic device start up data.

14. The at least one non-transitory, machine-readable medium of claim 13, wherein the testing data includes start up failure rate data.

15. The at least one non-transitory, machine-readable medium of claim 13, wherein the testing data includes start up duration data.

16. The at least one non-transitory, machine-readable medium of claim 10, wherein the first and second asynchronous serial data signals are, respectively, first and second universal asynchronous receiver-transmitter (UART) compliant data signals, and wherein the wireless power and data transfer protocol is a Near Field Communication (NFC) protocol.

17. A method of operating a testing device, the testing device for testing wireless power receiver systems in electronic devices, the method comprising:
generating testing signals for transmission to at least one of the electronic devices;
providing a driving signal for driving a transmitter antenna of the testing device, based on an operating frequency for the transmitter antenna, such that the transmitter antenna emits a transmission in accordance with the driving signal, wherein the driving signal is configured to generate a power signal and a first universal asynchronous receiver-transmitter (UART) compliant data signal in accordance with a Near Field Communication (NFC) wireless power and data transfer protocol, the first UART compliant data signal based on the testing signals;

receiving testing data, in response to the testing signals;

decoding the power signal to extract a second data signal compliant with the NFC wireless power and data transfer protocol; and decoding the second data signal to extract a second UART compliant data signal, the second UART compliant data signal based on the testing data.

18. The method of claim 17, further comprising generating the first and second UART compliant data signals in accordance with the NFC data transfer protocol by packetizing the first and second UART compliant data signals in a synchronous NFC data stream having a header with a synchronizing command and length command.

19. The method of claim 17, further comprising generating the first and second UART compliant data signals in accordance with the NFC data transfer protocol by including at least one error check element after the first and second UART compliant data signals.

20. The method of claim 19, further comprising generating an acknowledgement (ACK) response to be transmitted when processing of the at least one error check element indicates errorless receipt of the first and second UART compliant data signals.

* * * * *